United States Patent [19]

Yamada

[11] Patent Number: 5,410,192
[45] Date of Patent: Apr. 25, 1995

[54] POTENTIAL DATA SELECTION CIRCUIT

[75] Inventor: Shigeru Yamada, Yokohama, Japan

[73] Assignee: Kabushiki Kaisha Toshiba, Kawasaki, Japan

[21] Appl. No.: 79,564

[22] Filed: Jun. 22, 1993

[30] Foreign Application Priority Data

Jul. 9, 1992 [JP] Japan .................. 4-182492

[51] Int. Cl.$^6$ ................ G11C 8/00; H03K 3/01; H03K 17/00
[52] U.S. Cl. ................... 327/408; 327/94; 326/106
[58] Field of Search ............ 307/463, 296.1, 518, 307/243; 328/104, 154

[56] References Cited

U.S. PATENT DOCUMENTS

| | | | |
|---|---|---|---|
| 4,894,564 | 1/1990 | Sakashita | 307/296.01 |
| 4,985,703 | 1/1991 | Kaneyama | 307/243 |
| 5,032,739 | 7/1991 | Koh | 307/243 |
| 5,103,110 | 4/1992 | Housworth | 307/296.1 |
| 5,281,860 | 1/1994 | Krenik | 307/243 |

FOREIGN PATENT DOCUMENTS 4-343258 11/1992 Japan .

Primary Examiner—William L. Sikes
Assistant Examiner—Teep H. Nguyen
Attorney, Agent, or Firm—Foley & Lardner

[57] ABSTRACT

There is provided a potential data selection circuit suitable for use, e.g., in a device for driving a liquid crystal pane adapted for selecting an arbitrary one of a plurality of potential data to output the selected one. This potential data selection circuit comprises: a sample-hold circuit adapted for sampling and holding selection data of at least 2 bits to output them, and a decoder adapted to receive the selection data from the sample-hold circuit to decode them to output control signals. The potential data selection circuit further comprises a multiplexer including analog switches adapted to respectively receive at least two potential data, and responsive to the control signals from the decoder to control the operations of the analog switches to select any one of the potential data to output the selected one, and an output circuit adapted to receive the selected potential data to output a signal of a voltage of the selected potential data to the exterior.

14 Claims, 28 Drawing Sheets

POTENTIAL DATA SELECTION CIRCUIT

BACKGROUND OF THE INVENTION

This invention relates to a potential data selection circuit adapted for selecting any one of a plurality of potential data to output the selected data to the external.

In recent years, such potential data selection circuits have been used as devices for driving liquid crystal panels.

The circuit configuration of a conventional potential data selection circuit is shown in FIG. 1. This potential data selection circuit includes a sample-hold circuit 11, a decoder 13, and a multiplexer 175. The sample-hold circuit 11 is adapted so that data DaO and DbO for selecting potential data are inputted thereto to hold them, and includes clocked inverters 11a1 and 11b1 operative in response to an inputted clock $\phi L$, clocked inverters 11a3 and 11b3 operative in response to an inputted clock bar $\phi L$, and inverters 11a2 and 11b2. The input terminal of the clocked inverter 11a1 is connected to the input terminal to which data DaO is inputted. The input terminal of the inverter 11a2 is connected to the output terminal of the clocked inverter 11a1. A node N1a is connected to the output terminal of the inverter 11a2. The input terminal of the clocked inverter 11a3 is connected to the output terminal of the inverter 11a2. The output terminal of the clocked inverter 11a3 is connected to the input terminal of the inverter 11a2. Similarly, on the input terminal side where data DbO is inputted, the input terminal of the clocked inverter 11b1 is connected thereto, and the input terminal of the inverter 11b2 is connected to its output terminal. A node N1b is connected to the output terminal of the inverter 11b2. In addition, the input terminal of the clocked inverter 11b3 is connected to the output terminal of the inverter 11b2, and the output terminal of the clocked inverter 11b2 is connected to the input terminal of the inverter 11b2.

The decoder 13 is adapted so that data held in the sample-hole circuit 11 are given thereto to decode those data, and includes inverters 13a2, 13b2, 13c2, 13d2, 13f, 13g, and NOR gates 13a1, 13b1, 13c1, 13d1. To the node N1a on the output side of the sample-hold circuit 11, the input terminal of the inverter 13g and the input terminals of the NOR gates 13a1 and 13b1 are connected. Further, to the node N1b, the input terminal of the inverter 13f and the input terminals of the NOR gates 13a1 and 13c1 are connected. The output terminal of the inverter 13g is connected to the input terminals of the NOR gates 13c1 and 13d1, and the output terminal of the inverter 13f is connected to the input terminals of the NOR gates 13b1 and 13d1. The output terminal of the NOR gate 13a1 is connected to a node N2a2, and is connected to a node N2a1 through the inverter 13a2. The output terminal of the NOR gate 13b1 is connected to a node N2b2, and is connected also in parallel with a node N2b1 through the inverter 13b2. The output terminal of the NOR gate 13c1 is connected to a node N2c2, and is further connected to a node N2c1 through the inverter 13c2. In addition, the output terminal of the NOR gate 13d1 is connected to a node N2d2, and is also connected to a node N2d1 through the inverter 13d2.

The multiplexer 175 is adapted so that signals decoded by the decoder 13 and outputted therefrom are given thereto to select any one of signals to output the selected signal. This multiplexer 175 comprises an analog switch 175a including a P-channel transistor 175a1 and an N-channel transistor 175a2, an analog switch 175b including a P-channel transistor 175b1 and an N-channel transistor 175b2, an analog switch 175c including a P-channel transistor 175c1 and an N-channel transistor 175c2, and an analog switch 175d including a P-channel transistor 175d1 and an N-channel transistor 175d2.

In the analog switch 175a, the P-channel transistor 175a1 and the N-channel transistor 175a2 are connected in parallel, nodes N2a1 and N2a2 are respectively connected to their gates, and potential data Va is inputted to one end of the analog switch 175a. In the circuit 175b, the P-channel transistor 175b1 and the N-channel transistor 175b2 are connected in parallel, nodes N2b1 and N2b2 are respectively connected to their gates, and potential data Vb is inputted commonly to one end of the circuit 175b. In the analog switch 175c, the P-channel transistor 175c1 and the N-channel transistor 175c2 are connected in parallel, nodes N2c1 and N2c2 are respectively connected to their gates, and potential data Vc is inputted commonly to one end of the analog switch 175c. In the analog switch 175d, the P-channel transistor 175d1 and the N-channel transistor 175d2 are connected in parallel, nodes N2d1 and N2d2 are respectively connected to their gates, and potential data Vd is inputted commonly to one end of the analog switch 175d.

The operation of the potential data selection circuit thus constituted will now be described with reference to timings of FIG. 2. Data DaO, DbO are inputted to the sample-hold circuit 11. Further, a clock $\phi L$ and a clock bar $\phi L$ are inputted to the clocked inverters 11a1, 11a3, 11b1 and 11b3. In synchronism with the timing at which the clock $\phi L$ rises, data DaO, DbO are respectively sampled and held. These data are outputted as the held data Da1, Db1 from the nodes N1a and N1b of the sample-hold circuit 11.

These data Da1, Db1 are inputted to the decoder 13, at which they are decoded. Thus, a control signal 13a, a control signal bar 13a, a control signal 13b, a control signal bar 13b, a control signal 13c, a control signal bar 13c, a control signal 13d, and a control signal bar 13d are outputted from nodes N2a2, N2a1, N2b2, N2b1, N2c2, N2c1, N2d1 and N2d2, respectively. For example, in the case where data Da1, Db1 are all at logic "1" level, the control signal 13d is caused to be at logic "1" level, and the control signal bar 13d is caused to be at logic "0" level. Other control signals 13a, 13b and 13c are caused to be at logic "0" level, and control signal bar 13a, the signal bar 13b and the signal bar 13c are caused to be at logic "1" level.

These signals are inputted to the multiplexer 175. Only in the circuit 175d of these circuits 175a–175d, the P-channel transistor 175d1 and the N-channel transistor 175d2 are both turned ON. In other circuits 175a–175c, all transistors are turned OFF. Thus, only potential data Vd delivered to the circuit 175d of potential data Va, Vb, Vc and Vd is outputted to the exterior as an output Q.

In a manner as stated above, any one of analog switches 175a–175d is turned ON by combination of logic levels of selection data DaO, DbO input to the sample-hold circuit 11. As a result, any one of potential data Va–Vd is selected and the selected data is outputted.

The conventional circuit described above, however, has the following problems. In the case where a large capacity load is connected to the output terminal of the multiplexer 175, the drive speed is unable to be high unless the sizes of the analog switches 175a–175d are caused to be large to increase the respective output currents. Further, in order to increase such output currents, the widths of wires for delivering data potentials Va–Vd to the analog switches 175a–175d must be broadened in order that any electro-migration does not take place in wiring layers comprised of aluminum, etc.

In the liquid crystal panel, there is a tendency for the number of potential data to be selected and outputted to increase. Therefore, it is a problem that if the number of potential data increases, the area of the mask pattern would increase.

SUMMARY OF THE INVENTION

An object of this invention is to provide a potential data selection circuit capable of suppressing an increase of the area of the mask pattern.

In accordance with this invention, there is provided a potential data selection circuit comprising: a sample-hold circuit adapted for sampling and holding selection data of at least two bits to output such data, a decoder adapted so that the selection data outputted from the sample-hold circuit are given thereto to decode them to output control signals, a multiplexer including analog switches adapted so that at least two potential data are respectively given thereto, and adapted so that the control signals outputted from the decoder are given thereto to control the operations of the analog switches to select any one of the potential data to output the selected one, and an output circuit adapted so that the potential data which has been selected and outputted by the multiplexer is given thereto to output a signal of a voltage corresponding to the selected potential data to the exterior.

In operation, by the sample-hold circuit, selection data are sampled and held, and are outputted therefrom. The selection data thus outputted are delivered to the decoder, at which they are decoded. As a result, control signals are outputted. These control signals are delivered to the analog switches of the multiplexer so that their operations are controlled. As a result, any one of given potential data is selected and is outputted. The potential data thus outputted is delivered to the output circuit. Thus, a signal of a voltage corresponding to the potential data is outputted to the external. By employing a circuit configuration to output potential data outputted from the multiplexer to the external via the output circuit, it is sufficient to allow the current supply capability of the output circuit to be high for the purpose of satisfying predetermined standard requirements for this potential data selection circuit, and large dimensions are not required for the analog switch and/or the width of the wire for applying potential data. For this reason, the dimension of the pattern can be reduced.

The above-mentioned multiplexer may comprise an initial potential setting circuit, analog switches each comprised of an N-channel MOS transistor, and a discharging unit. In this case, the initial potential setting circuit may serve to set a potential on the output terminal to an initial potential higher than both potentials of at least two potential data. The analog switch may be adapted so that the potential data are given thereto to select any one of the potential data on the basis of the control signals outputted from the decoder to output the selected potential data. In addition, the discharging unit may be adapted to carry out a discharge operation to allow a potential on the output terminal set to the initial potential by the initial potential setting circuit to decrease to a potential of the potential data selected by the analog switch and outputted therefrom, thus to provide an output for the potential data.

In this case, after a potential on the output terminal is set to an initial potential by the initial potential setting circuit, potential data is selected by the analog switch. At this time, a discharge operation is carried out by the discharging section so that the potential on the output terminal is reduced from the initial potential to a potential of the selected potential data, whereby output of potential data is carried out. In the preferred embodiment, since the analog switch is comprised of an N-channel MOS transistor, as the source potential becomes closer to a higher value of the power supply voltage, the potential difference between the gate and the source becomes smaller and on state resistance becomes larger. In view of this, an approach is employed to set an initial potential on the output terminal higher than both potential data to carry out a discharge operation to allow its potential level to fall to the level of potential data, thereby making it possible to output the potential data at a precise level.

Further, the above-mentioned multiplexer may comprise an initial potential setting circuit, an analog switch comprised of a P-channel MOS transistor, and a charging unit. In this case, the initial potential setting circuit may set in advance a potential on the output terminal so than it becomes equal to an initial potential lower than both potentials of at least two potential data. The analog switches may be adapted so that the potential data are given thereto to select any one of the potential data on the basis of the control signals outputted from the decoder to output the selected potential data. In addition, the charging unit may be adapted to carry out a charge operation to allow the potential on the output terminal set to the initial potential by the initial potential setting unit to rise to a potential of the potential data selected by the analog switch and output therefrom, thus to output the potential data.

In the case where the analog switch is comprised of a P-channel MOS transistor as described above, as the source potential becomes closer to a lower value of the power supply voltage, the potential difference between the gate and the source becomes smaller, and on state resistance becomes larger in a manner opposite to the above. Accordingly, an approach is employed to set in advance the potential on the output terminal to an initial potential lower than both potentials of the potential data to carry out a charge operation to allow its potential level to rise to the level of the potential data, thereby making it possible to output the potential data at a precise level.

Further, the potential data selection circuit of this invention may comprise plural sets of sample-hold circuits, decoders, multiplexers, and output circuits which have been described above, and further comprise first sample-hold circuits provided respectively in correspondence with these sample-hole circuits, the first sample-hold circuits being connected to a data bus common thereto to sequentially sample and hold selection data of at least two bits serially transferred by way of the data bus to output them, the sample-hold circuits being adapted so that the selection data outputted from the first sample-hold circuits respectively corresponding thereto are given thereto to hold and output them.

In this case, selection data which have been serially transferred by way of the data bus connected commonly to the first sample-hold circuits are sequentially held by the first sample-hold circuits and are outputted therefrom. The selection data thus outputted are respectively delivered to corresponding sample-hold circuits. The operation at the time subsequent thereto is the same as above. In this case, since the potential data selection circuit includes a plurality of multiplexers, the output circuits corresponding thereto are provided, thereby making it possible to enhance, to a greater degree, the effect for reducing the pattern area obtained by reducing respective dimensions of the analog switches of the multiplexer and the widths of wires for delivering potential data to the analog switches.

Further, the potential data selection circuit of this invention may comprise a sample-hold circuit for sampling and holding selection data of at least two bits to output them; a multiplexer including an inversion selection data generation unit; and an analog switch comprised of a plurality of MOS transistors adapted so that at least two potential data are respectively given thereto; the inversion selection data generation unit being adapted so that the selection data outputted from the sample-hold circuit are given thereto to generate inverted inversion selection data, the analog switch being adapted so that the selection data and the inversion selection data are applied to the gates of the MOS transistors to control their ON/OFF operations to thereby select any one of the potential data to output the selected potential data; and an output circuit adapted so that the potential data selected by the multiplexer and outputted therefrom is given thereto to output a signal of a voltage corresponding to the selected potential data to the exterior.

In the case where the multiplexer includes an inversion selection data generation unit, analog switches each comprised of a plurality of N-channel MOS transistors, and a discharging unit, selection data and inverted inversion selection data are used to control the operations of the analog switches to thereby double as the function of a decoder, thereby making it possible to reduce the area of the mask pattern to a greater degree. In addition, since the analog switch is comprised of MOS transistors of the single conductivity type, a more satisfactory contribution to reduction of the pattern area is provided.

This similarly applies also in the case where the multiplexer includes analog switches each comprised of P-channel transistors and a charging unit.

In the preferred embodiment, the potential data selection circuit includes plural sets of sample-hold circuits, multiplexers and output circuits which have been described above, and further includes first sample-hold circuits respectively corresponding to the sample-hold circuits, the first sample-hold circuits being respectively connected to a common data bus to sequentially sample and hold selection data of at least two bits serially transferred by way of the data bus to output those data; the sample-hold circuits that the potential data selection circuits respectively have being adapted so that the selection data respectively outputted from the corresponding first sample-hold circuits are given thereto to hold and output those data.

In this case, the decoder is unnecessary, and the dimensions of the analog switches of the multiplexer and the widths of the wires for delivering potential data to the analog switches are reduced, thereby making it possible to provide a greater advantage for reducing the pattern area.

The above-mentioned output circuit may be comprised of a voltage follower amplifier.

In the preferred embodiment, higher drive capability can be provided by using such a voltage follower amplifier as the output circuit. Thus, an external load of large capacity can be driven at a high speed.

In addition, the output circuit may comprise a control circuit for allowing small current consumption of the output circuit, a control circuit for allowing an output of the output circuit to be placed in a high impedance state, an analog switch connecting the output terminal of the multiplexer and the output terminal of the potential data selection circuit, and a control circuit for controlling the analog switch.

In this case, when data which has been subjected to sample-hold operation is switched so that the output potential is switched, the same potential as an output potential of the multiplexer is outputted by an output circuit having a large drive capability, thus permitting the operation speed to be high. If there is employed an approach such that after switching the output potential, power consumption of the output circuit is allowed to be lower to allow the output to be placed in a high impedance state to directly output an output potential of the multiplexer as an output of the potential data selection circuit through the analog switch, and to directly output an input potential of the output circuit as an output of the output potential data selection circuit, thereby making it possible to eliminate a small error between the input potential and the output potential of the output circuit, and to lower power consumption.

DESCRIPTION OF THE PREFERRED EMBODIMENTS

A potential data selection circuit according to a first embodiment of this invention will now be described.

Figure 3:
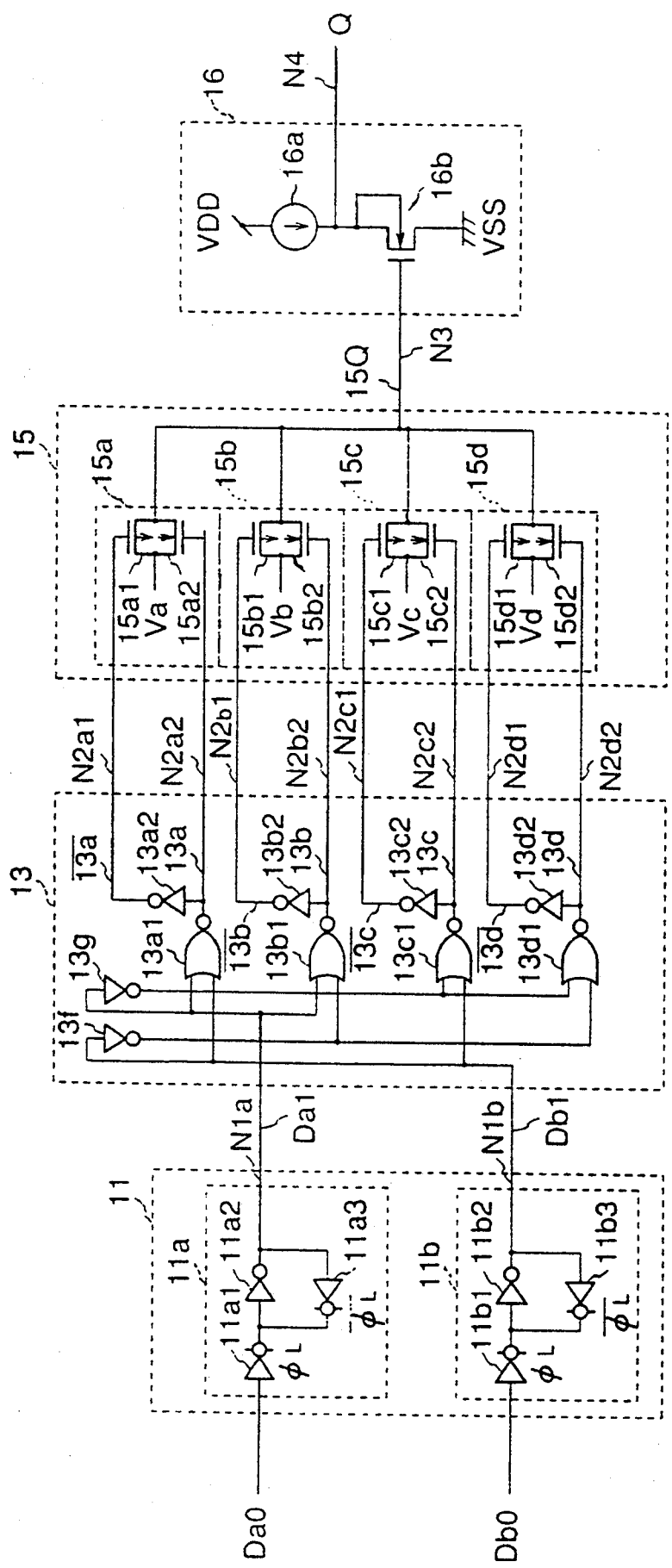
FIG. 3 is a circuit diagram showing the configuration of a potential data selection circuit according to a first embodiment of this invention.

The potential data selection circuit according to the first embodiment has a configuration as shown in FIG. 3.

Figure 1:
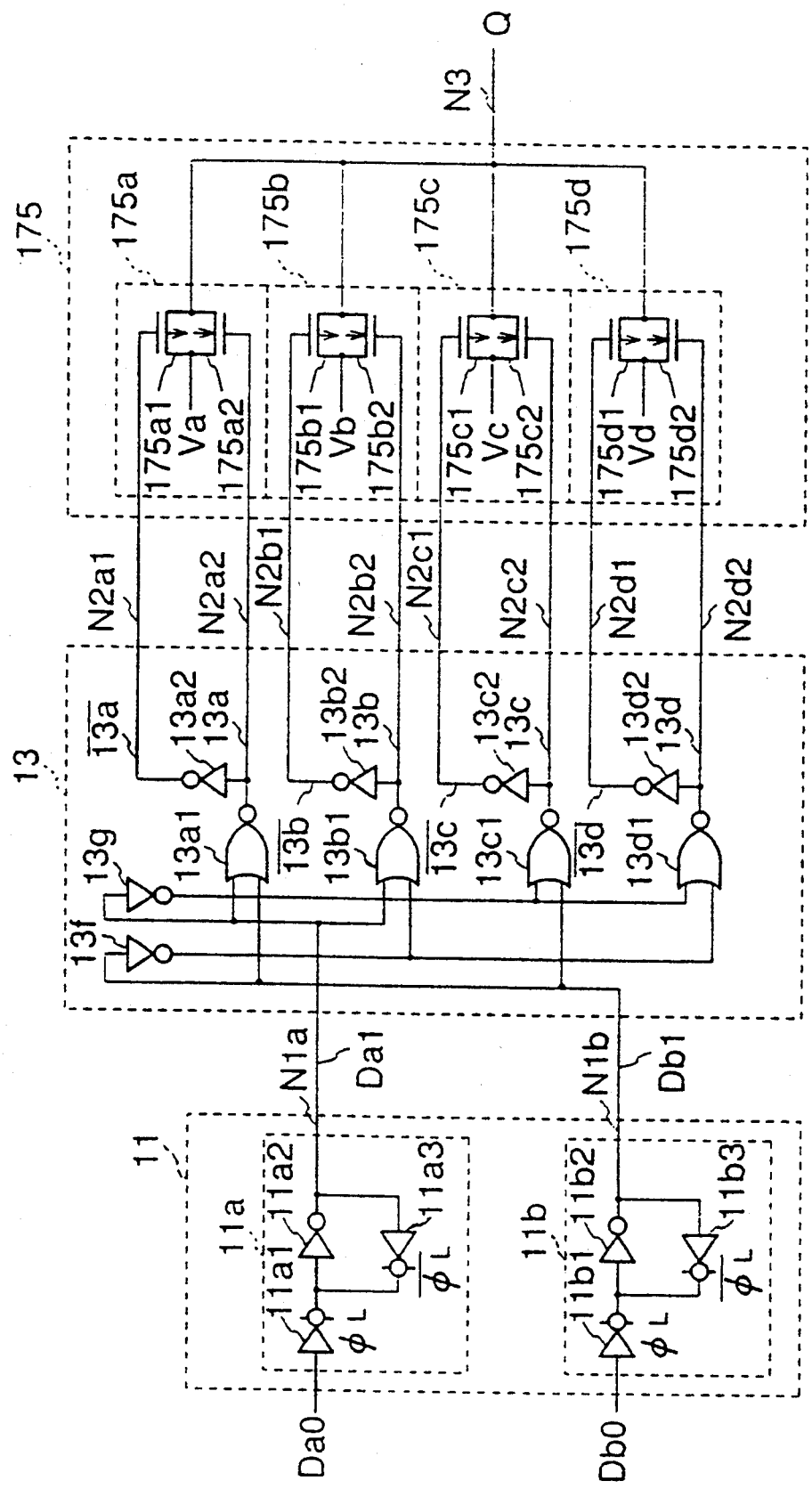
FIG. 1 is a conventional circuit diagram showing the configuration of a potential data selection circuit.

As compared to the conventional circuit shown in FIG. 1, the circuit of the first embodiment differs from the former in that a source follower amplifier 16 is provided at the node N3 of the output terminal of the multiplexer 175. This source follower amplifier 16 includes a current source 16a and an N-channel transistor 16b. Between the power supply voltage VDD terminal and the ground terminal (VSS), the current source 16a and the N-channel transistor 16b are connected in series. A node N4 connecting therebetween is connected to the output terminal of this potential data selection circuit. The gate of the N-channel transistor 16b is connected to the node N3 of the output terminal of a multiplexer 15.

The internal configuration of analog switches 15a–15d of the multiplexer 15 is the same as that of the multiplexer 175 shown in FIG. 1 in the circuit diagram. It is to be noted that the dimensions of P-channel transistors 15a1–15d1 and N-channel transistors 15a2–15d2 are set to values smaller than those of P-channel transistors 175a1–175d1 and N-channel transistors 175a2–175d2 in FIG. 1.

Further, the widths of wires for respectively delivering potential data $Va$–$Vd$ to the P-channel transistors 15a1–15d1 and N-channel transistors 15a2–15d2 are narrow.

The same reference numerals are respectively attached to the same components as other components shown in FIG. 1, and their explanation will be omitted.

Figure 2:
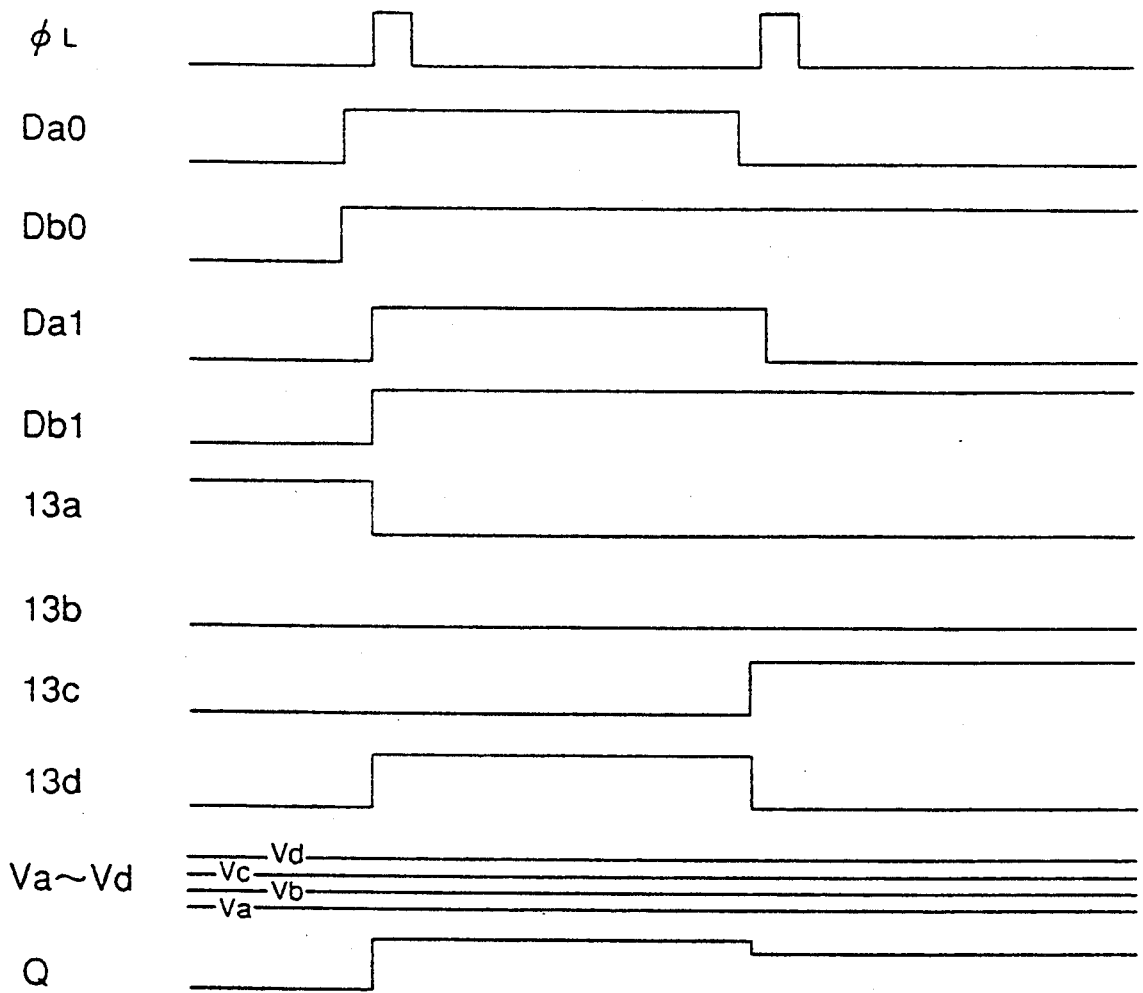
FIG. 2 is a timing chart showing waveforms of respective signals in the above-mentioned potential data selection circuit.
Figure 5:
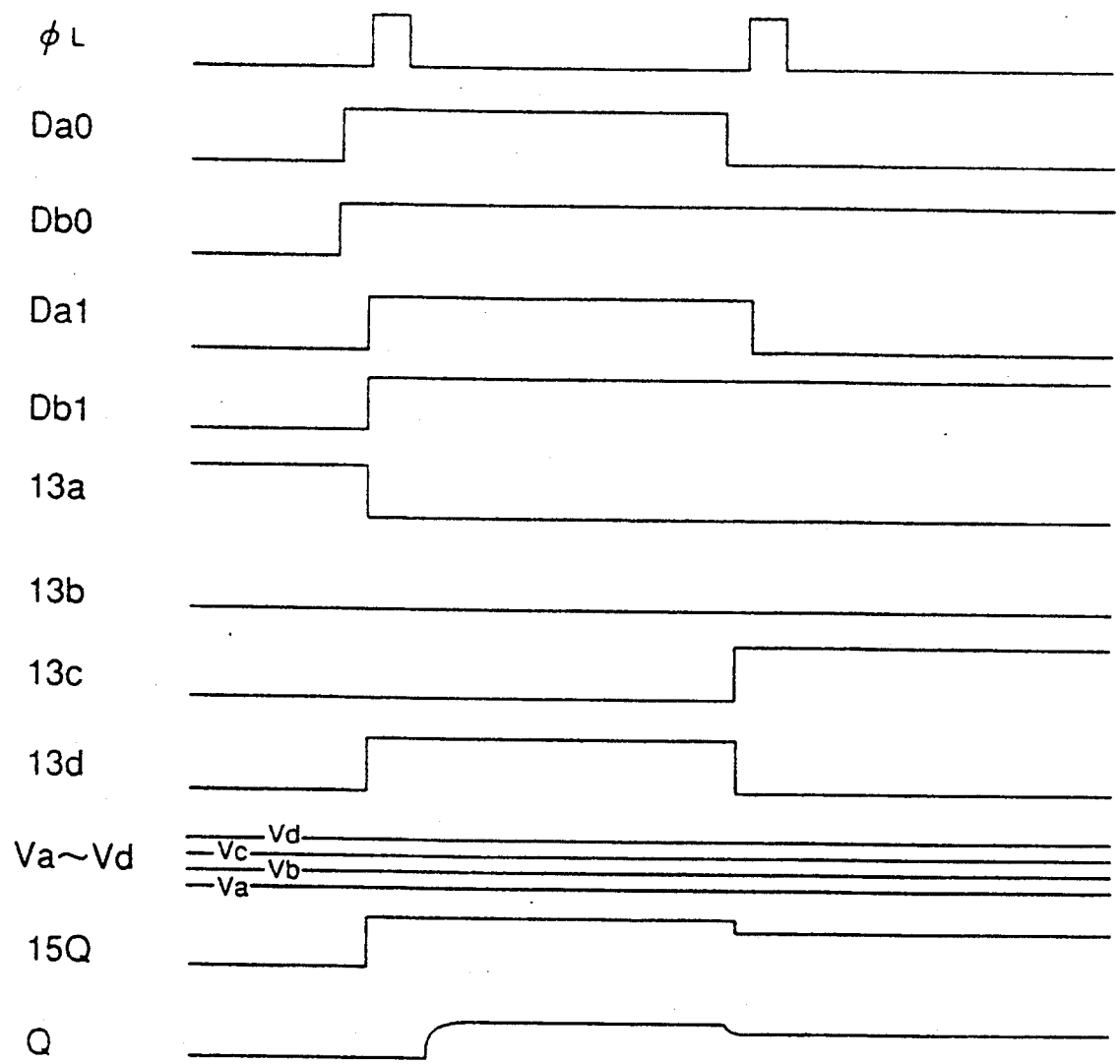
FIG. 5 is a timing chart showing waveforms of respective signals in the above-mentioned first or second embodiment.

The operation contents of the sample-hold circuit 11, the decoder 13 and the multiplexer 15 are the same as those shown in FIG. 1. Further, the timing chart of respective signals is as shown in FIG. 5, and is the same as the timing chart in FIG. 2 except for outputs 15Q and Q.

Namely, selection data $DaO$, $DbO$ are inputted to the sample-hold circuit 11, and are held in synchronism with a clock $\phi L$ and a clock bar $\phi L$. The data held in the sample-hold circuit 11 are outputted to the decoder 13 as data Da1, Db1. In the decoder 13, a control signal 13a and a control signal bar 13a, a control signal 13b and a control signal bar 13b, a control signal 13c and a control signal bar 13c, and a control signal 13d and a control signal bar 13d corresponding to the combination of logic levels of the data Da1 and Db1 are generated. These control signals are inputted to the multiplexer 15, so any one of analog switches 15a–15d is turned ON. Thus, potential data inputted to an analog switch which has been turned ON of potential data $Va$–$Vd$ respectively inputted to the analog switches 15a 15d is outputted to the node N3 as a signal 15Q.

This signal 15Q is inputted to the gate of the N-channel transistor 16b of the source follower amplifier 16. Further, potential data $Va$–$Vd$ have potentials different from each other as shown in FIG. 5. Thus, the N-channel transistor 16b will have a resistance value corresponding to a potential of a selected one of potential data $Va$–$Vd$. As a result, a signal Q having the same potential as that of selected potential data is outputted from the output terminal node N4 of the source follower amplifier 16.

In accordance with the first embodiment, output of selected potential data is carried out through the source follower amplifier 16. Accordingly, also in the case of driving, at a high speed, a load of a large capacity, it is sufficient to allow the current drive capability of the source follower amplifier 16 to be large. In this case, there is no need of enhancing the current drive capability of analog switches 15a–15d of the multiplexer 15, or broadening the widths of the wires for delivering potential data $Va$–$Vd$. Thus, the area of the mask pattern is reduced.

Figure 4:
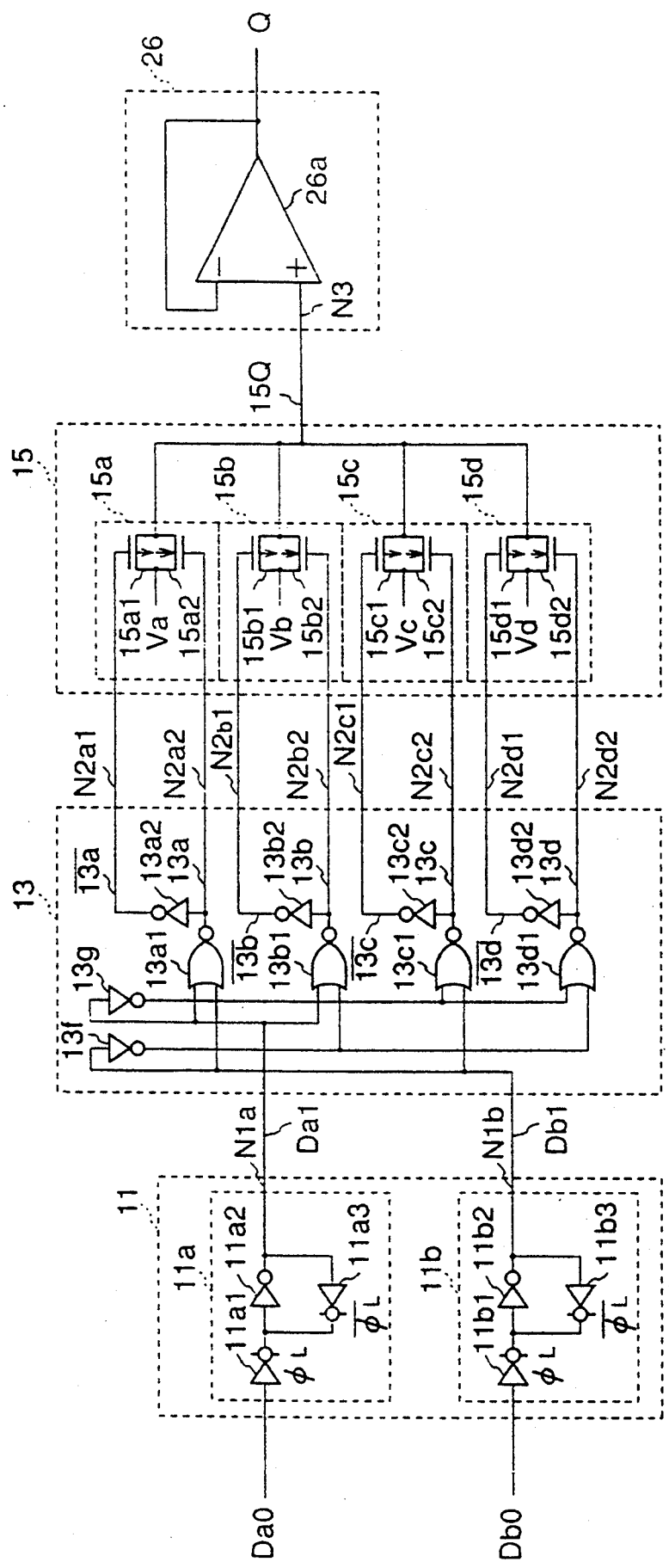
FIG. 4 is a circuit diagram showing the configuration of a potential data selection circuit according to a second embodiment of this invention.

The configuration of a potential data selection circuit according to a second embodiment of this invention is shown in FIG. 4. This second embodiment corresponds to the embodiment where a voltage follower amplifier 26 is used in place of the source follower amplifier 16 in the above-mentioned first embodiment. The voltage follower amplifier 26 includes a differential amplifier 26a. The node N3 of the output terminal of the multiplexer 15 is connected to the non-inverting input terminal of the differential amplifier 26a, and the output terminal of the differential amplifier 26a is connected to the inverting input terminal.

The timing chart of respective signals in the second embodiment is as shown in FIG. 5 similarly to the first embodiment. Also in accordance with the second embodiment, effects/advantages similar to those of the first embodiment can be provided. Namely, selection of potential data V$a$-V$d$ is carried out in dependency upon data D$a$O and D$b$O. The selected data is subjected to impedance conversion at the voltage follower amplifier 26, and is then outputted to the exterior. Thus, it is possible to drive, at a high speed, a large capacity external load by allowing the drive capability of the voltage follower amplifier 26 to be high without necessity of enhancing the current drive capability of the analog switches 15a–15d, or broadening the widths of wires for delivering potential data V$a$-V$d$.

Figure 6:
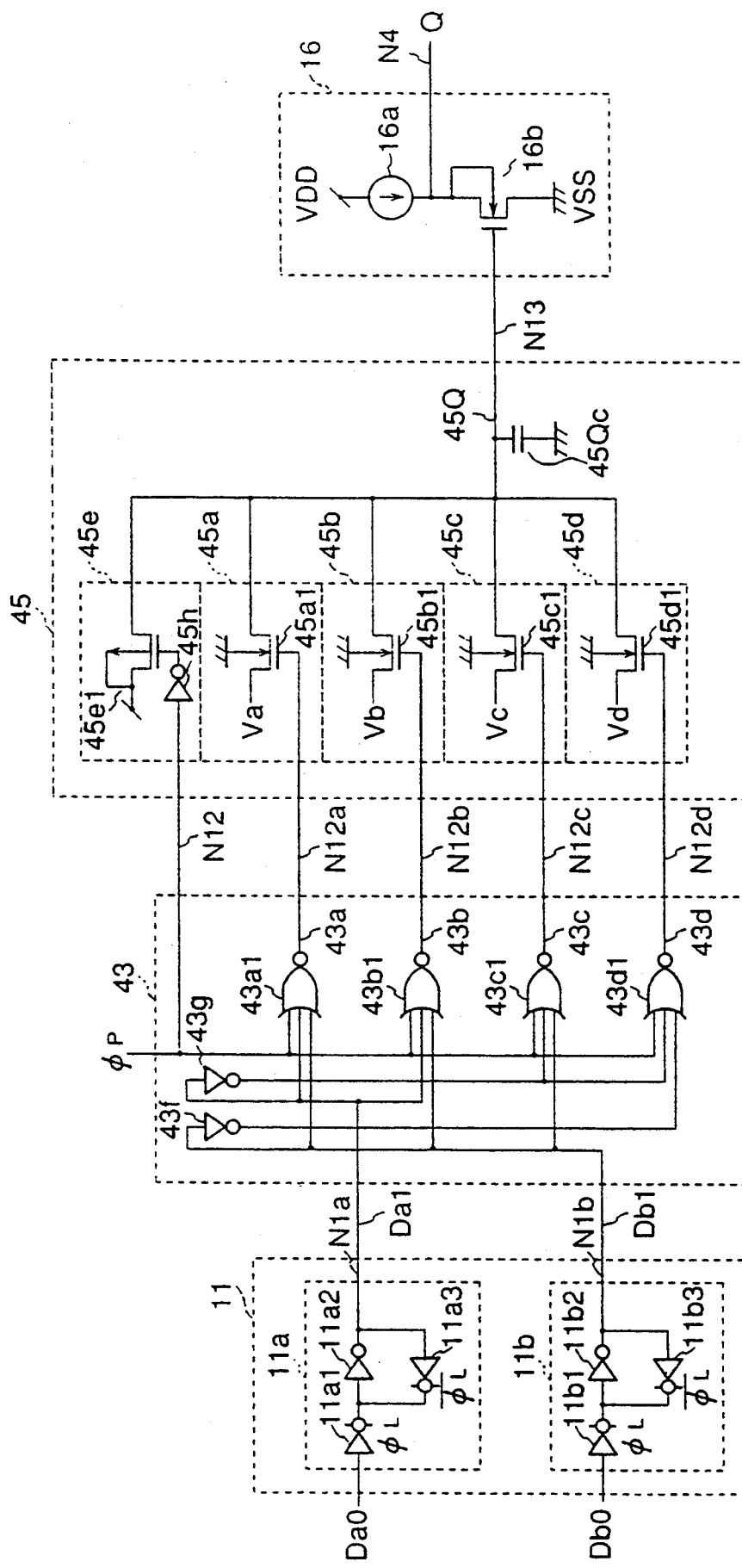
FIG. 6 is a circuit diagram showing the configuration of a potential data selection circuit according to a third embodiment of this invention.

A third embodiment of this invention will now be described. The configuration of this embodiment includes, as shown in FIG. 6, a sample-hold circuit 11, a decoder 43, a multiplexer 45 and source follower amplifier 16. As compared to the first embodiment shown in FIG. 3, the configurations of the decoder 43 and the multiplexer 45 are different from the former in this embodiment.

The decoder 43 includes inverters 43f and 43g, and three-input NOR gates 43a1–43d1. The input terminal of the inverter 43g is connected to the output terminal node N1a of the sample-hold circuit 11, and the input terminal of the inverter 43f is connected to the output terminal node N1b. To the input terminal of the NOR circuit 43a1, an initial potential setting signal $\phi p$ terminal, and nodes N1a and N1b are connected. Further, to the input terminal of the NOR circuit 43b1, the initial potential setting signal $\phi p$ input terminal, the node N1a and the output terminal of the inverter 43f are connected. Further, to the input terminal of the NOR circuit 43c1, the initial potential setting signal $\phi p$ terminal, the output terminal of the inverter 43g, and the node N1b are connected. To the input terminal of the NOR circuit 43d1, the initial potential setting signal $\phi p$ input terminal, and the output terminals of the inverters 43g and 43f are connected.

The multiplexer 45 includes an initial potential setting circuit 45e, and analog switches 45a–45d. The initial potential setting circuit 45e includes an inverter 45h, and a P-channel transistor 45e1. The input terminal of the inverter 45h is connected to a node N12 connected to the initial potential setting signal $\phi p$ input terminal, and the output terminal of the inverter 45h is connected to the gate of the P-channel transistor 45e1. The source of the P-channel transistor 45e1 is connected to the power supply voltage VDD terminal, and the drain thereof is connected to a node N13 of the output terminal of the multiplexer 45. These analog switches 45a–45d include N-channel transistors 45a1–45d1, respectively. At the analog switch 45a, a node N12a of the output terminal of the NOR gate 43a1 of the decoder 43 is connected to the gate of the N-channel transistor 45a1, and a signal line through which potential data V$a$ is delivered is connected to the drain of the N-channel transistor 45a1. At the analog switch 45b, a node N12b of the output terminal of the NOR gate 43b1 of the decoder 43 is connected to the gate of the N-channel transistor 45b1, and a signal line through which potential data V$b$ is delivered is connected to the drain of the N-channel transistor 45b1. At the analog switch 45c, a node N12c of the output terminal of the NOR gate 43c1 of the decoder 43 is connected to the gate of the N-channel transistor 45c1, and a signal line through which potential data V$c$ is delivered is connected to the drain of the N-channel transistor 45c1. At the analog switch 45d, a node N12d of the output terminal of the NOR gate 43d1 of the decoder 43 is connected to the gate of the N-channel transistor 45d1, and a signal line through which potential data V$d$ is delivered is connected to the drain of the N-channel transistor 45d1. In addition, sources of the N-channel transistors 45a1–45d1 are all connected to the output terminal node N13. At the node N13, a capacitor 45QC exists between this node and the ground potential Vss. In this case, the capacitor 45QC may be a capacitor parasitic on the signal line, or may be a capacitor provided as an element. It is to be noted that it is desirable that the capacity of the capacitor 45QC has a larger value in order to prevent the influence of noise.

Figure 8:
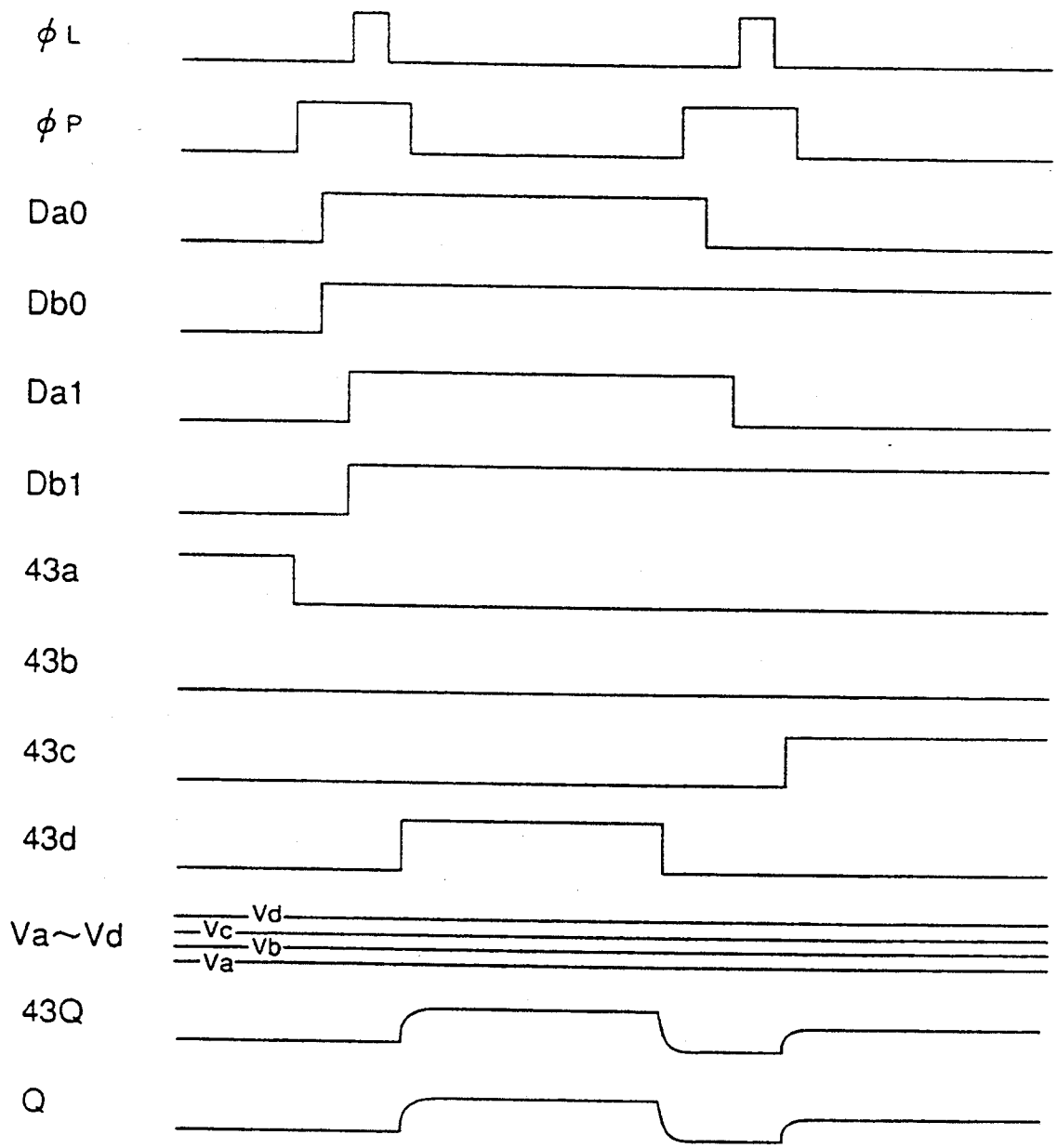
FIG. 8 is a timing chart showing waveforms of respective signals in the above-mentioned third or fourth embodiment.

The potential data selection circuit of the third embodiment operates as follows. The timing chart of respective signals at this time is shown in FIG. 8. In the case of switching outputs of potential data V$a$-V$d$, the initial potential setting signal $\phi p$ is first caused to be at logic "1" level. At this time, outputs of the NOR gates 43a1–43d1 are all caused to be at logic "0" level. As a result, the analog switches 45a–45d are all turned OFF, resulting in an output of logic "0" level. Then, the P-channel transistor 45e1 of the initial potential setting circuit 45e is turned ON. As a result, the capacitor 45QC is charged so that the potential becomes equal to the power supply potential VDD. At this time, the level of the power supply potential VDD is higher than all of levels of potential data V$a$-V$d$.

Thereafter, data D$a$O and D$b$O are inputted to the sample-hold circuit 11, and data D$a$1 and D$b$1 are outputted to the decoder 43. As a result, the initial potential setting signal $\phi p$ is caused to be at logic "0" level, so the initial potential setting circuit 45e is turned OFF. Thus, charging operation into the capacitor 45QC is completed.

Assuming that data D$a$1 and D$b$1 both represent logic "1" level, only the NOR gate 43d1 of NOR gates 43a1–43d1 of the decoder 43 provides an output of the logic "1" level. As a result, only the analog switch 45d of analog switches 45a–45d of the multiplexer 45 is turned ON. As the result of the fact that the N-channel transistor 45d1 where potential data V$d$ has been inputted to its drain is turned ON, the capacitor 45QC is discharged from the level of the power supply potential VDD down to the level of a potential of the potential data V$d$.

This potential data V$d$ is inputted to the source follower amplifier 16, and is subjected to impedance conversion similarly to the third embodiment. Thus, such potential data is outputted as data Q from the output terminal node N4.

In this embodiment, the multiplexer 45 is used to carry out a charge operation such that a potential on the node 13 rises to the power supply potential VDD to carry out a discharge operation of the potential on the node 13 when any selected one of potential data V$a$-V$d$ is outputted. The reason why such an approach is employed is as follows. First, analog switches 45a–45d adapted to select one of potential data V$a$-V$d$ to output selected data are all comprised of N-channel transistors, respectively. Further, since potential data Va–Vd take a value closer to the power supply voltage VDD, the potential difference between the source and the gate becomes smaller, and on state resistance becomes large. In view of this, it is preferable to set the potential of the output terminal node N13 to the power supply potential VDD at an initial stage.

In contrast, in the case where the analog switches are constituted only by P-channel transistors, since according as potential data closer to the ground potential Vss is outputted, the potential difference between the gate and the source becomes smaller, so the on state resistance becomes larger. Accordingly, it is desirable that such a setting is made at an initial stage to allow the level of the node on the output side of the analog switch to be equal to the level in the vicinity of the ground potential Vss.

Figure 7:
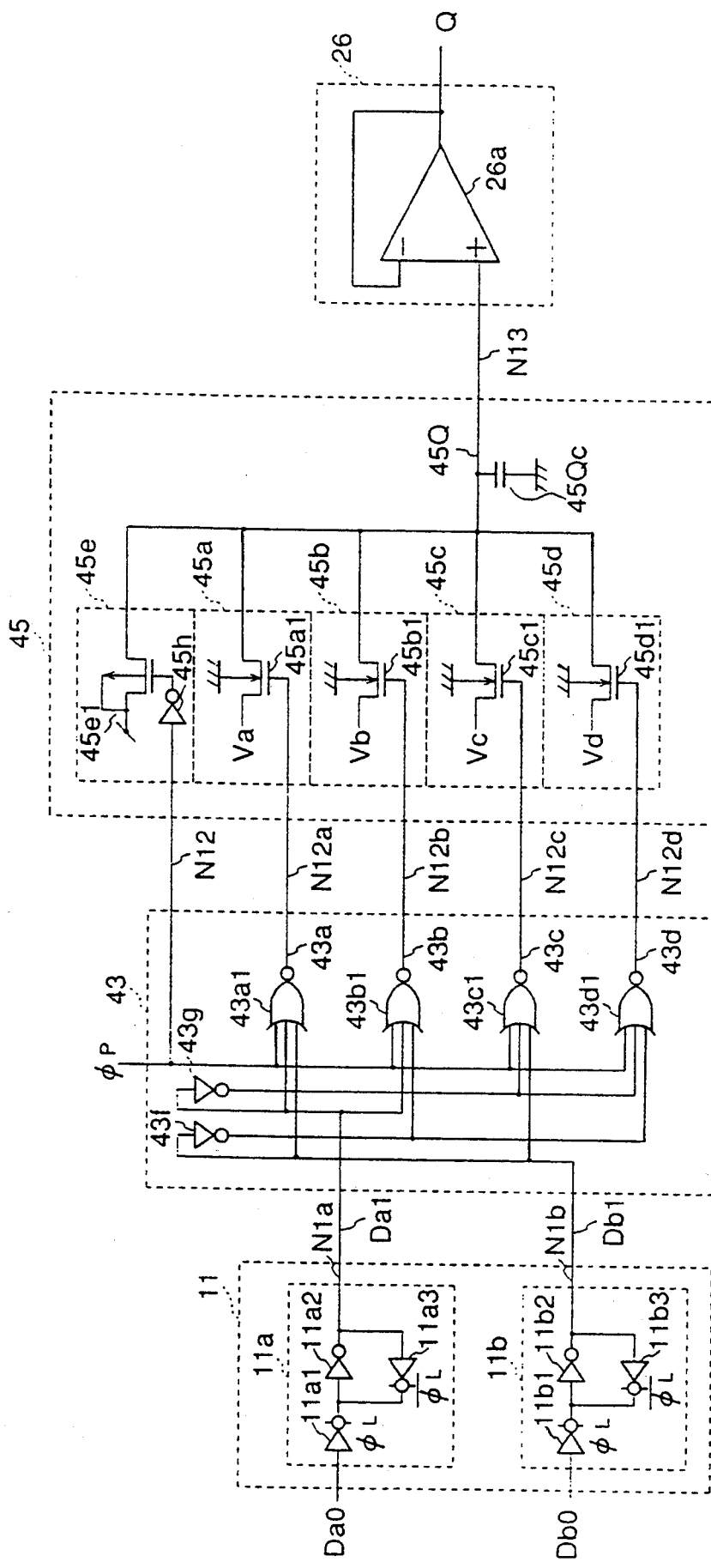
FIG. 7 is a circuit diagram showing the configuration of a potential data selection circuit according to a fourth embodiment of this invention.

A fourth embodiment of this invention has a configuration as shown in FIG. 7. The fourth embodiment corresponds to the embodiment where the source follower amplifier 16 is replaced by a voltage follower amplifier 26 in the above-described third embodiment. The timing chart of respective signals is as shown in FIG. 8 similarly to the third embodiment. From the multiplexer 45 to the voltage follower amplifier 26, selected one of potential data Va–Vd is outputted. The potential data thus outputted is subjected to impedance conversion, and is then outputted to the exterior.

Figure 9:
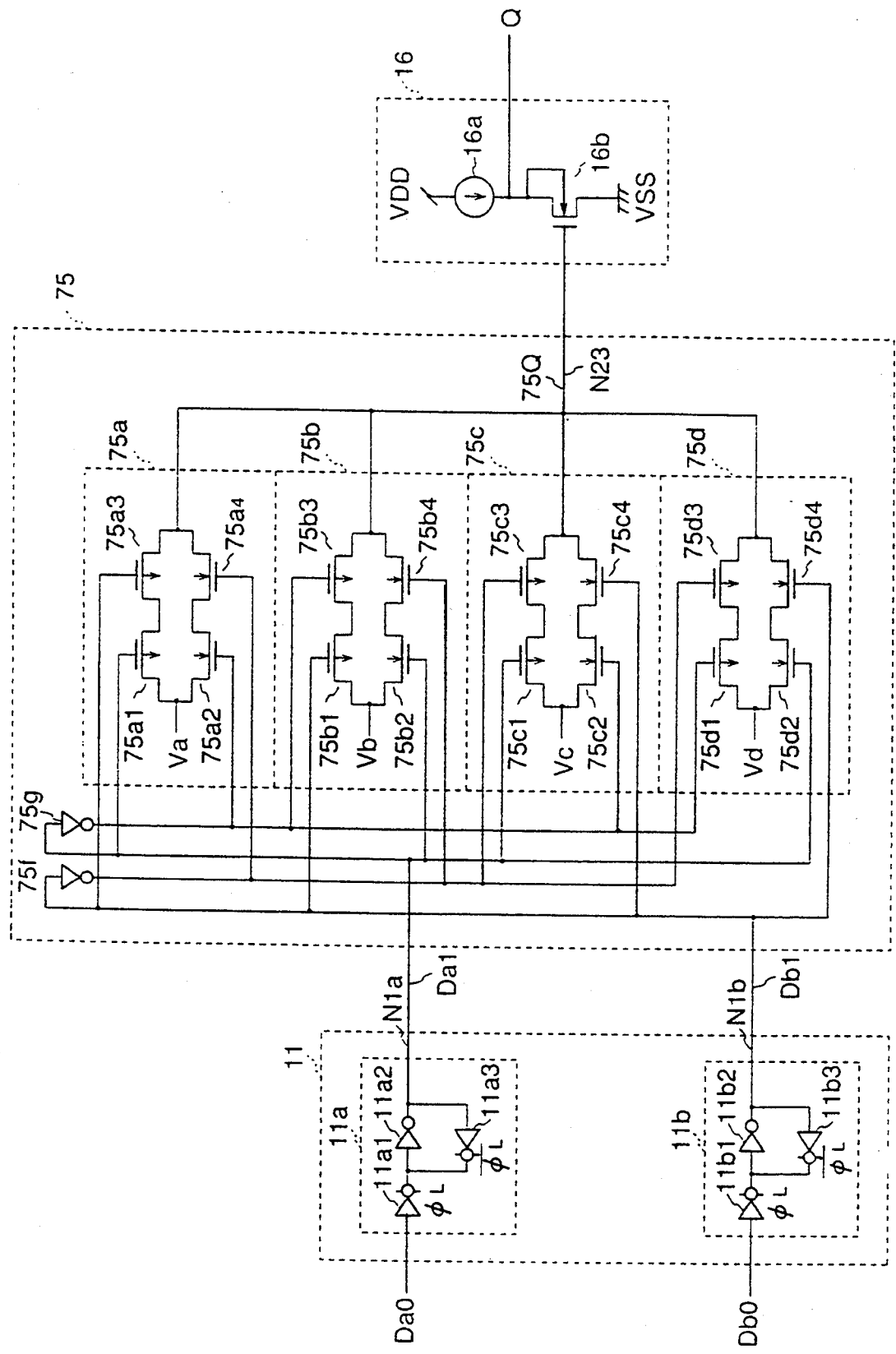
FIG. 9 is a circuit diagram showing the configuration of a potential data selection circuit according to a fifth embodiment of this invention.

The configuration of a potential data selection circuit according to a fifth embodiment of this invention is shown in FIG. 9. The potential data selection circuit of this embodiment includes a sample-hold circuit 11, a multiplexer 75 and a source follower amplifier 16. As compared to the first and third embodiments, this embodiment is the same with respect to the sample-hold circuit 11 and the source follower amplifier 16, but differs from the first/third embodiments in that the multiplexer 75 is caused to have the function of the decoder in place of providing the decoder.

The multiplexer 75 includes inverters 75f and 75g corresponding to the inversion selection data generation unit, and analog switches 75a–75d. The input terminal of the inverter 75g is connected to the node N1a of the output terminal of the sample-hold circuit 11, and the input terminal of the inverter 75f is connected to the node N1b. The analog switches 75a–75d include P-channel transistors 75a1 and 75a3 and N-channel transistors 75a2 and 75a4, P-channel transistors 75b1 and 75b3 and N-channel transistors 75b2 and 75b4, P-channel transistors 75c1 and 75c3 and N-channel transistors 75c2 and 75c4, and P-channel transistors 75d1 and 75d3 and N-channel transistors 75d2 and 75d4, respectively.

Explanation will now be given by taking an example of the analog switch 75a. Between a signal line for delivering potential data Va and a node N23 of the output terminal of the multiplexer 75, P-channel transistors 75a1 and 75a3 are connected in series. Between a potential data supply line and the node N23 of the output terminal, N-channel transistors 75a2 and 75a4 are connected in series in parallel with the P-channel transistor 75a1 and 75a3. Also in other analog switches 75c–75d, between potential data Vb–Vd supply lines and the node N23 of the output terminal, P-channel transistors and N-channel transistors are respectively provided on the basis of a similar connection relationship.

At the analog switch 75a, the gate of the P-channel transistor 75a1 is connected to the node N1a of the output terminal, the gate of the P-channel transistor 75a3 is connected to the node N1b of the output terminal, the gate of the N-channel transistor 75a2 is connected to the output terminal of the inverter 75g, and the gate of the N-channel transistor 75a4 is connected to the output terminal of an inverter 75f. At the analog switch 75b, the gate of the P-channel transistor 75b1 is connected to the node N1b of the output terminal, the gate of the P-channel transistor 75b3 is connected to the output terminal of the inverter 75g, the gate of the N-channel transistor 75b2 is connected to the node N1a of the output terminal, and the gate of the N-channel transistor 75b4 is connected to the output terminal of the inverter 75f. At the analog switch 75c, the gate of the P-channel transistor 75c1 is connected to the output terminal node N1a, the gate of the P-channel transistor 75c3 is connected to the output terminal of the inverter 75f, the gate of the N-channel transistor 75c2 is connected to the output terminal of the inverter 75g, and the gate of the N-channel transistor 75c4 is connected to the output terminal node N1b. At the analog switch 75d, the gate of the P-channel transistor 75d1 is connected to the output terminal of the inverter 75g, the gate of the P-channel transistor 75d3 is connected to the output terminal of the inverter 75f, the gate of the N-channel transistor 75d2 is connected to the node N1a, and the gate of the N-channel transistor 75d4 is connected to the node N1b.

Figure 11:
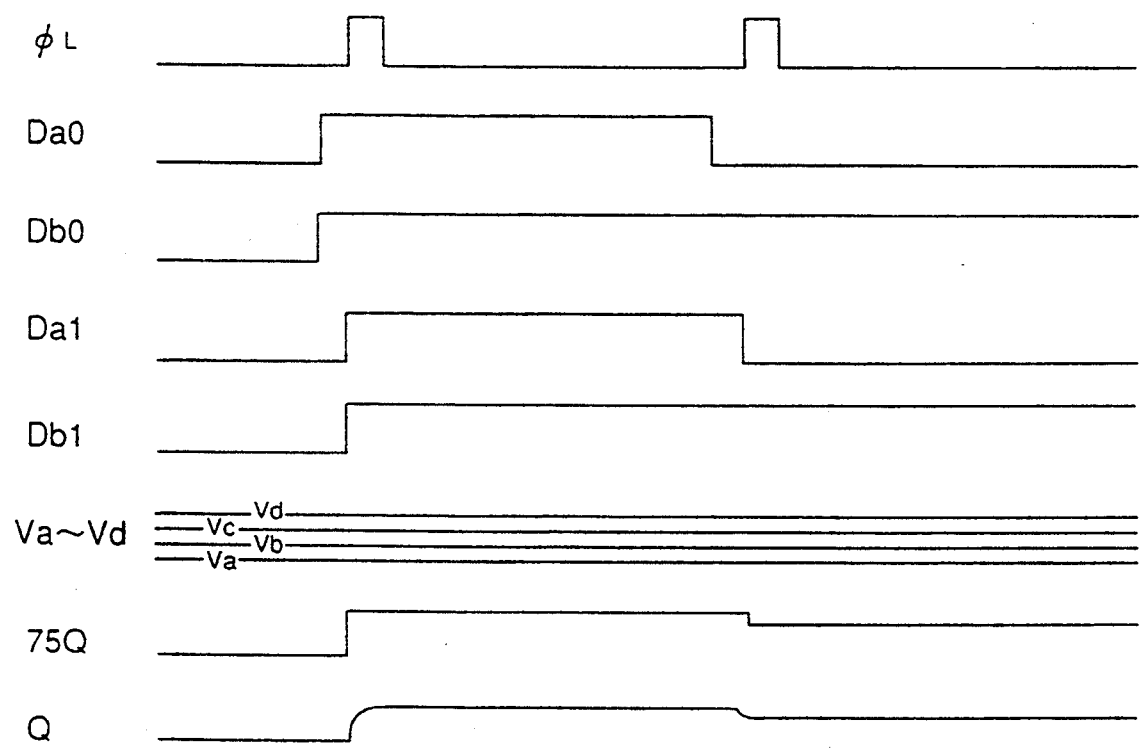
FIG. 11 is a timing chart showing waveforms of respective signals in the above-mentioned fifth or sixth embodiment.

Explanation will now be given in connection with the operation of the fifth embodiment by taking an example of FIG. 11 showing the timing chart of the respective signals.

Selection data DaO and DbO are inputted to the sample-hold circuit 11 and are held in synchronism with a clock $\phi L$. The data Da1 and Db1 thus held are outputted to the multiplexer 75. The data Da1, Db1 and data bar obtained by inverting those data by means of inverters 75f and 75g are outputted to the respective analog switches 75a–75d.

When the case where the data Da1, Db1 are both at logic "1" level is taken as an example, P-channel transistors 75d1 and 75d3, and N-channel transistors 75d2 and 75d4 of the analog switch 75d are all turned ON. As a result, the potential data Vd supply line and the output terminal node N23 are connected. At this time, other analog switches 75a–75c are all turned OFF. Thus, potential data Vd is selected, and is outputted to the node N23 as dats 75Q. This data 75Q is subjected to impedance conversion by the source follower amplifier 16, and is outputted as data Q.

Figure 10:
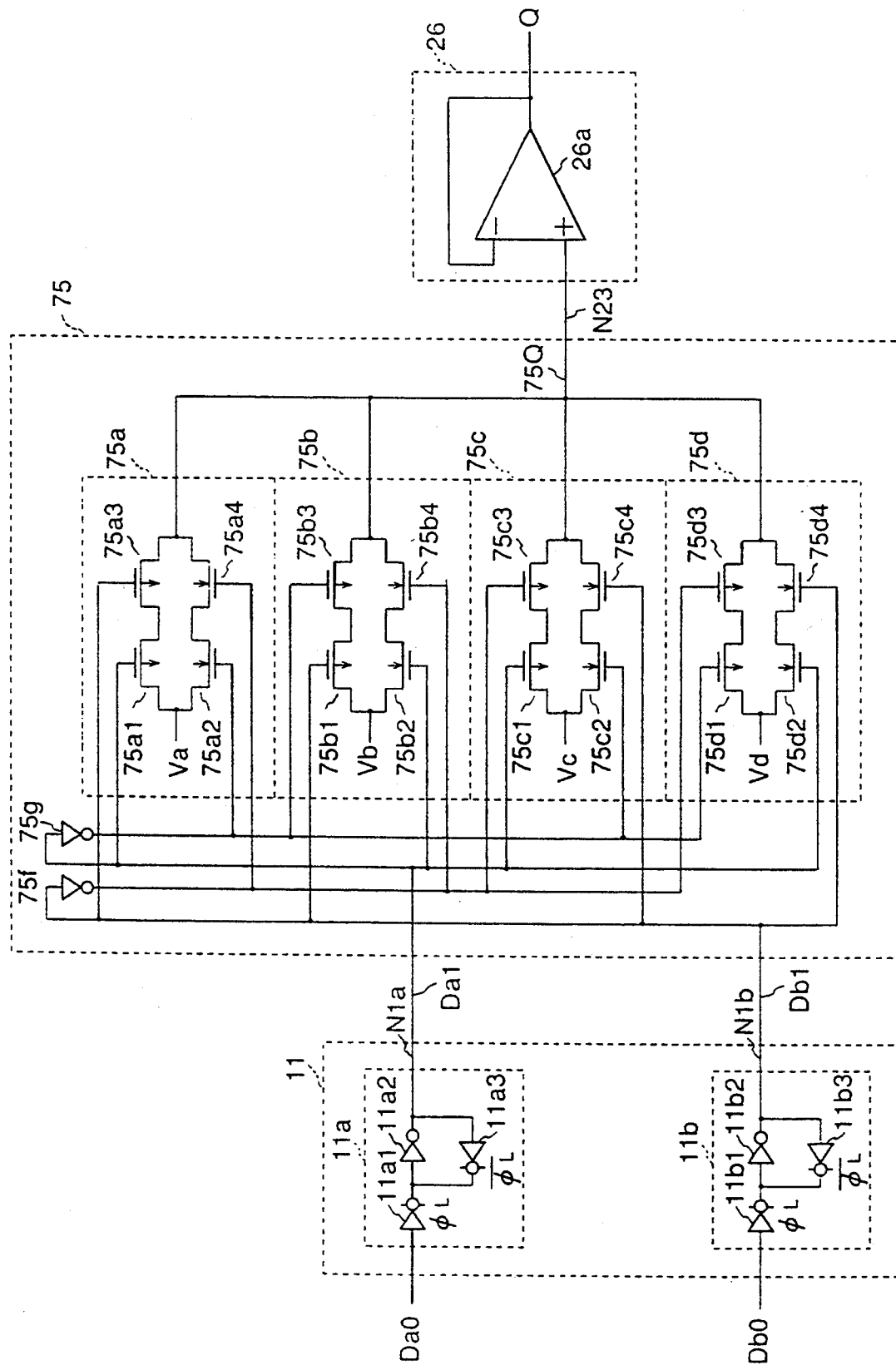
FIG. 10 is a circuit diagram showing the configuration of a potential data selection circuit according to a sixth embodiment of this invention.

A potential data selection circuit according to a sixth embodiment of this invention has a configuration as shown in FIG. 10. This embodiment corresponds to the embodiment where the source follower amplifier 16 in the fifth embodiment is replaced by a voltage follower amplifier 26. In a manner similar to the fifth embodiment, any one of potential data Va–Vd is selected at the multiplexer 75, and is then subjected to impedance conversion at the voltage follower amplifier 26. The data thus obtained is outputted as data Q.

Figure 12:
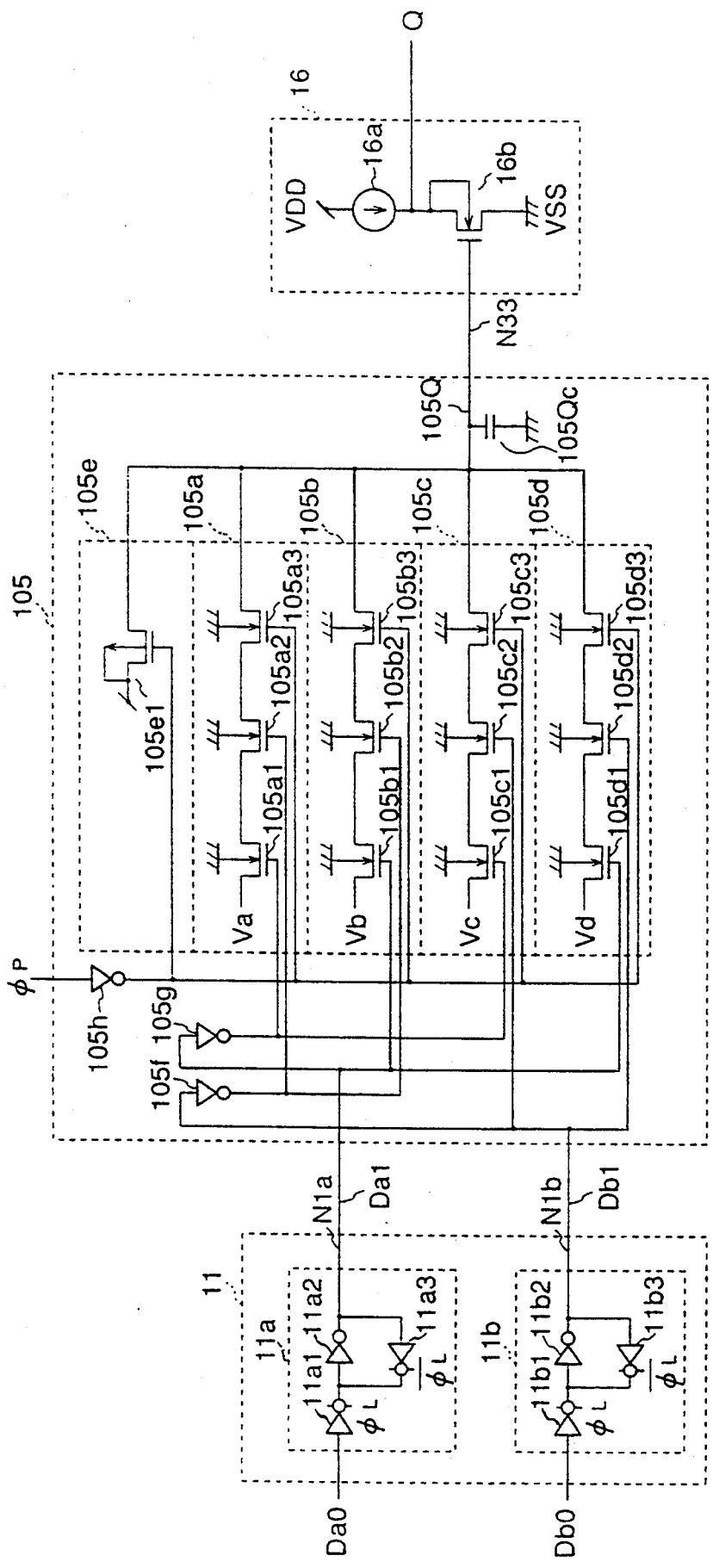
FIG. 12 is a circuit diagram showing the configuration of a potential data selection circuit according to an seventh embodiment of this invention.

A potential data selection circuit according to an seventh embodiment of this invention will now be described with reference to FIG. 12. This embodiment corresponds to the embodiment where the configuration of the multiplexer in the fifth embodiment is modified. A multiplexer 105 includes inverters 105f, 105g and 105h, an initial potential setting circuit 105e, and analog switches 105a–105d. The input terminal of the inverter 105g is connected to the node N1a, and the input terminal of the inverter 105f is connected to the node N1b. In addition, the input terminal of the inverter 105h is connected to the initial potential setting signal φp input terminal.

The initial potential setting circuit 105e includes a P-channel transistor 105e1. The source of the P-channel transistor 105e1 is connected to the power supply potential VDD terminal, the drain thereof is connected to a node N33 of the output terminal, and the gate thereof is connected to the output terminal of the inverter 105h.

Analog switches 105a–105d include N-channel transistors 105a1–105a3, 105b1–105b3, 105c1–105c3, and 105d1–105d3, respectively. At the analog switch 105a, between the supply line for potential data Va and a node N33, N-channel transistors 105a1–105a3 are connected in series. The gate of the N-channel transistor 105a1 is connected to the output terminal of the inverter 105g, the gate of the N-channel transistor 105a2 is connected to the output terminal of the inverter 105f, and the gate of the N-channel transistor 105a3 is connected to the output terminal of the inverter 105h. The gate of the N-channel transistor 105b1 is connected to the node N1a, the gate of the N-channel transistor 105b2 is connected to the output terminal of the inverter 105f, and the gate of the N-channel transistor 105b3 is connected to the output terminal of the inverter 105h. The gate of the N-channel transistor 105c1 is connected to the output terminal of the inverter 105g, the gate of the N-channel transistor 105c2 is connected to the node N1b, and the gate of the N-channel transistor 105c3 is connected to the output terminal of the inverter 105h. The gate of the N-channel transistor 105d1 is connected to the node N1a, the gate of the N-channel transistor 105d2 is connected to the node N1b, and the gate of the N-channel transistor 105d3 is connected to the output terminal of the inverter 105h.

Figure 14:
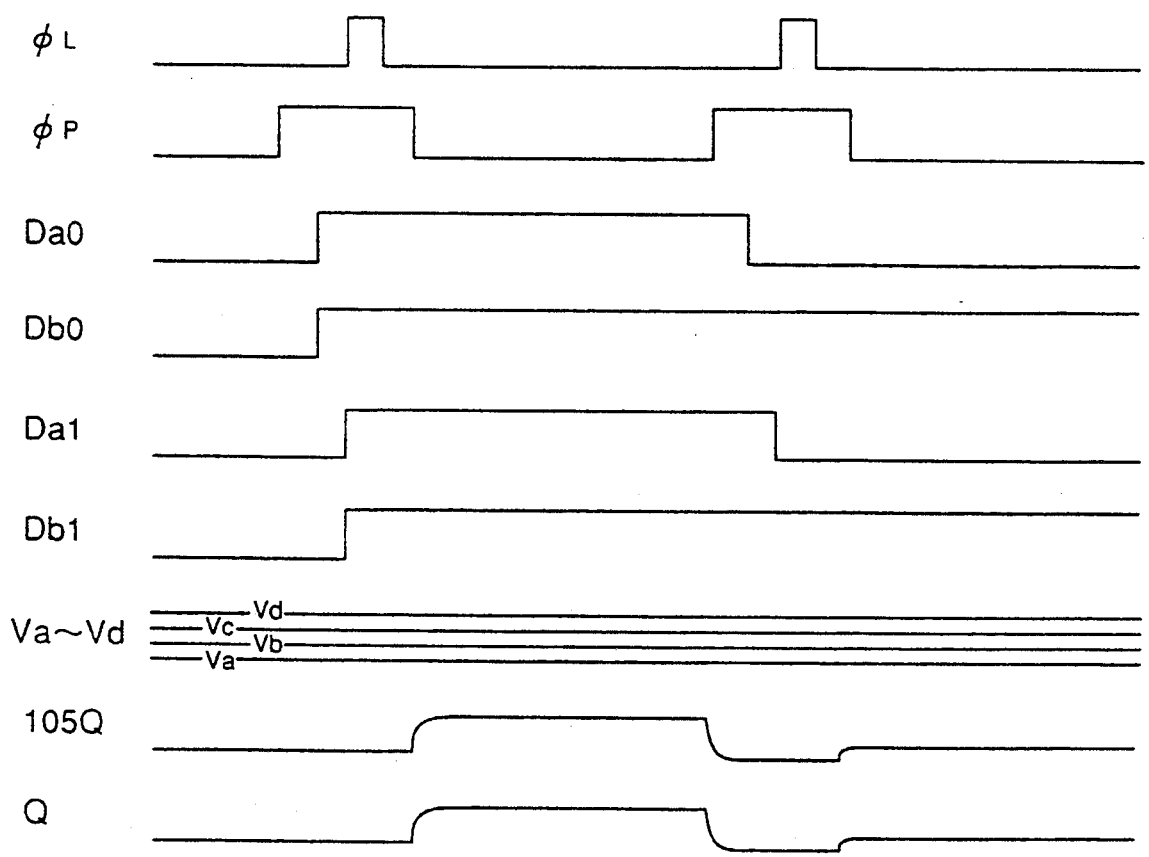
FIG. 14 is a timing chart showing waveforms of respective signals in the above-mentioned seventh or eighth embodiment.

The timing chart of respective signals in the seventh embodiment is shown in FIG. 14. When switching of output of potential data is carried out, the initial potential setting signal φp is first caused to be at logic "1" level similarly to the fifth embodiment. As a result, analog switches 105a–105d of the multiplexer 105 are all turned OFF, and the initial potential setting circuit 105e is turned ON. Thus, the potential on the node N33 is set to the power supply potential VDD as the result of the fact that a capacitor 105QC is charged by the P-channel transistor 105e1 of the initial potential setting circuit 105.

The data Da0 and Db0 are inputted to the sample-hold circuit 11, at which they are held. Such data are outputted to the multiplexer 105 as data Da1 and Db1. Thereafter, the initial potential setting signal φp is caused to be at logic "0" level. As a result, the initial potential setting circuit 105e is turned OFF, so charging of the capacitor 105QC is completed. When the case where data Da1 and Db1 are both at logic "1" level is taken as an example, only the analog switch 105d of the analog switches 105a–105d is turned ON. Thus, a discharge operation is carried out such that the level of the potential on the node N33 is lowered from the level of the power supply potential VDD to the level of the potential data Vd. The potential data Vd outputted to the node N33 is subjected to impedance conversion at the source follower amplifier 16, and is outputted to the exterior as data Q.

Figure 13:
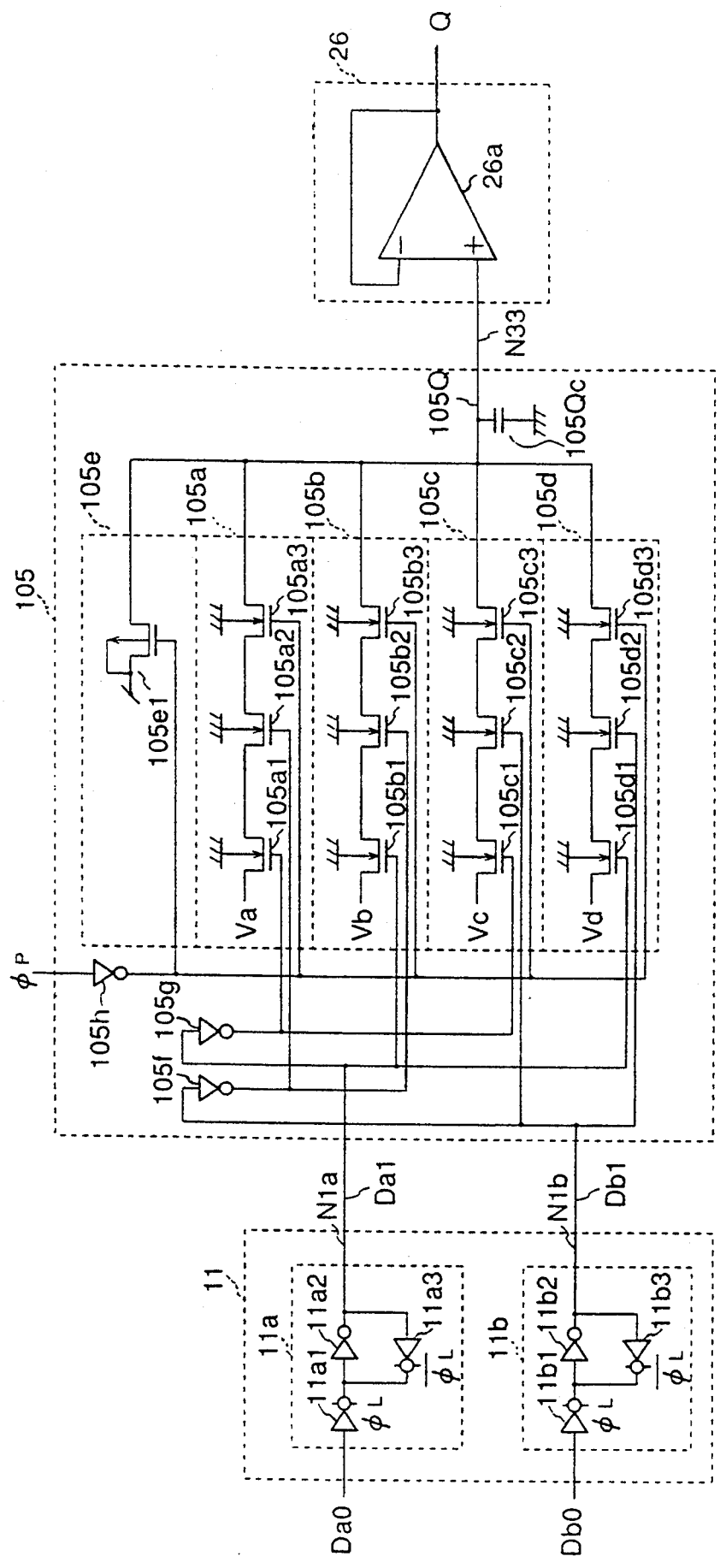
FIG. 13 is a circuit diagram showing the configuration of a potential data selection circuit according to an eighth embodiment of this invention.

A potential data selection circuit according to a eighth embodiment of this invention has a configuration as shown in FIG. 13. As compared to the sixth embodiment, this embodiment differs therefrom in that the source follower amplifier 16 is replaced by the voltage follower amplifier 26. Also in the seventh embodiment, any one of potential data Va–Vd is selected by the multiplexer 105 and is outputted therefrom. The potential data thus obtained is subjected to impedance conversion at the voltage follower amplifier 26, and is outputted therefrom.

Figure 15:
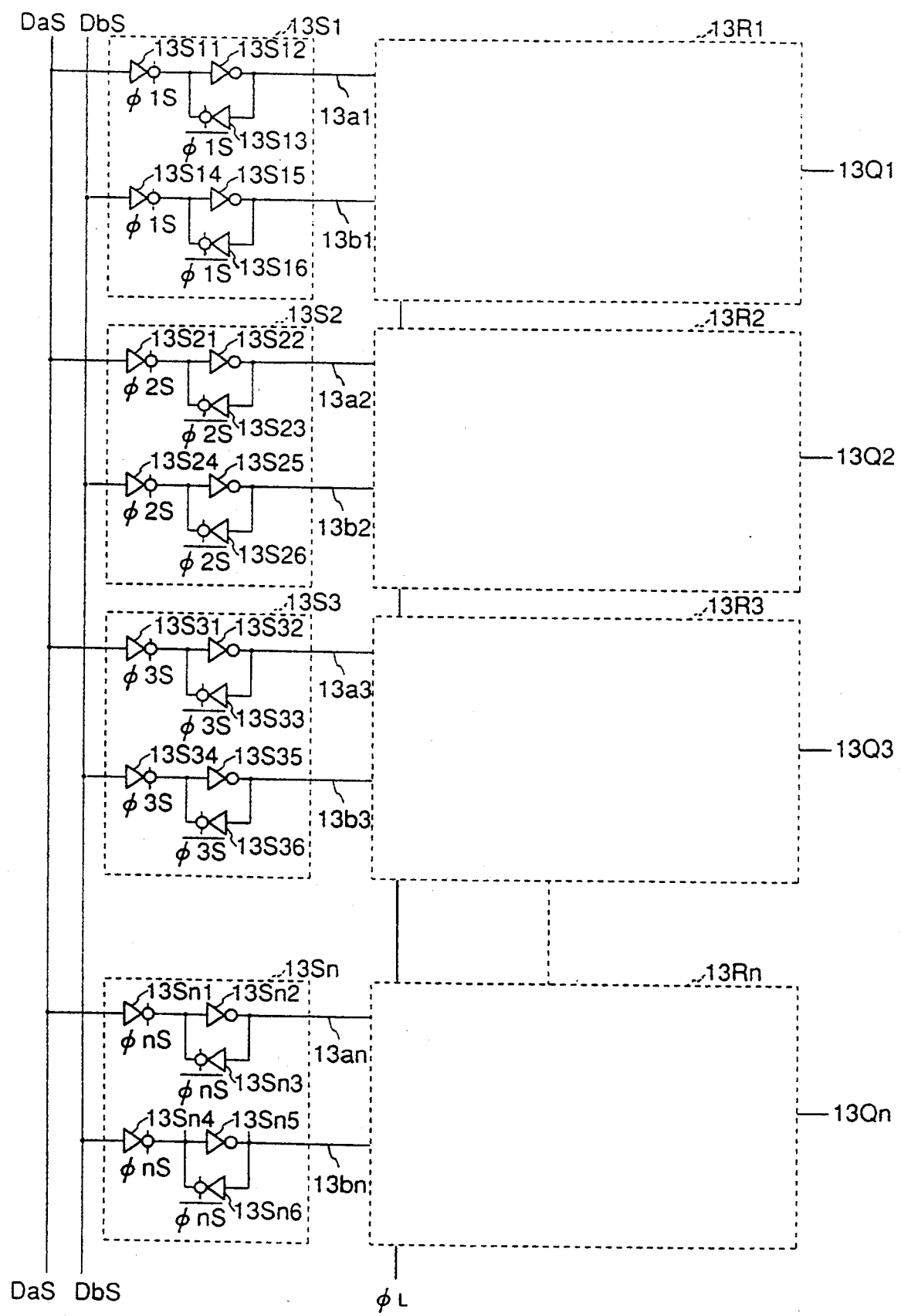
FIG. 15 is a circuit diagram showing the configuration of a potential data selection circuit according to a ninth embodiment of this invention.
Figure 16:
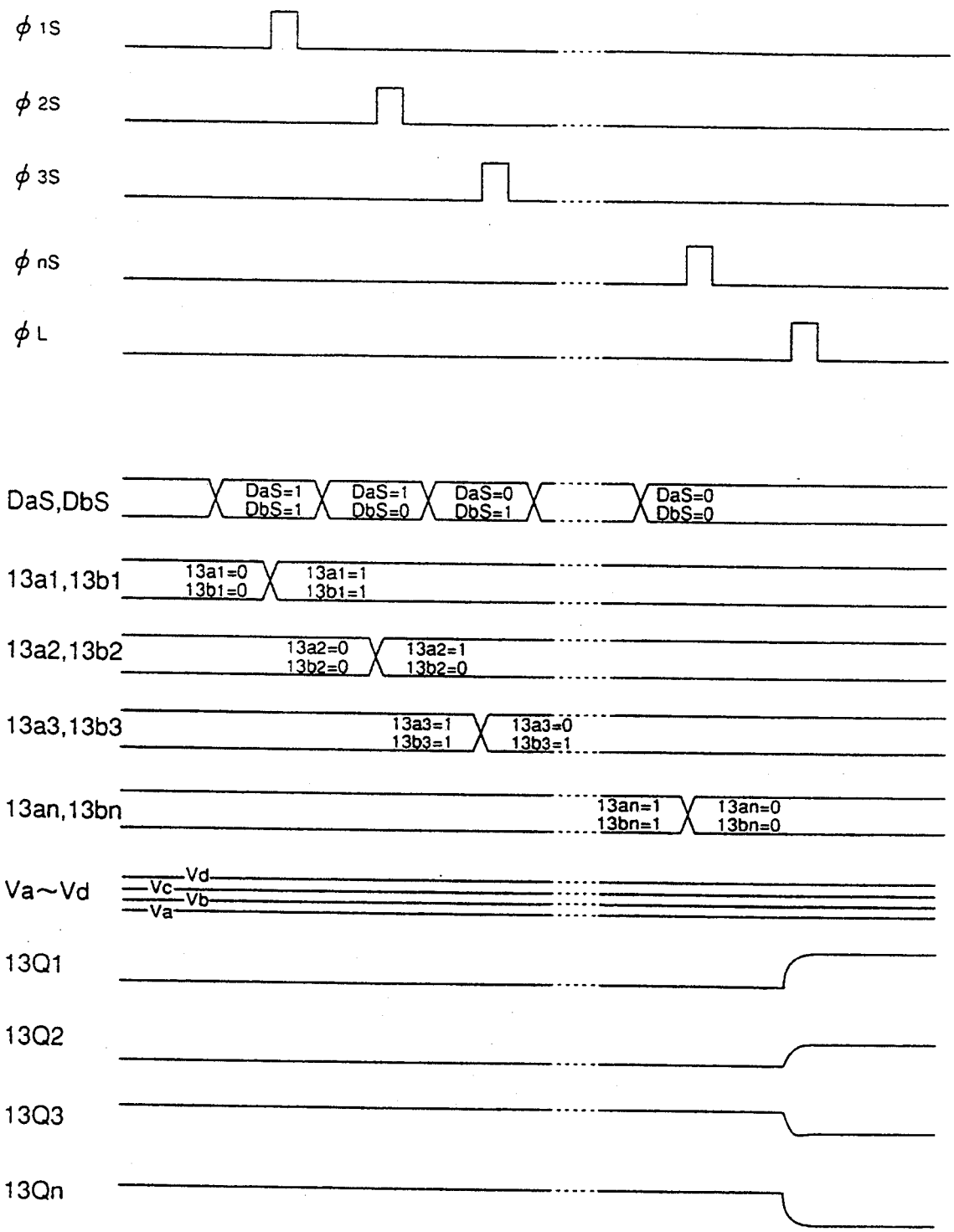
FIG. 16 is a timing chart showing waveforms of respective signals in the above-mentioned ninth embodiment.

A potential data selection circuit according to a ninth embodiment of this invention will now be described. The configuration of this embodiment is as shown in FIG. 15, and is characterized in that the entire potential data selection circuit includes n (n is an integer equal to 2 or more) potential data selection circuits 13R1–13Rn according to any one of the above-described first, second, fifth and sixth embodiments, and that sample-hold circuits 13S1–13Sn are supplemented in correspondence with the respective potential data selection circuits 13R1–13Rn. The timing chart of respective signals in the tenth embodiment is as shown in FIG. 16.

In this embodiment, sample-hold circuits 13S1–13Sn have a configuration similar to that of the sample-hold circuit 11 in any one of the above-described first, second, fifth and sixth embodiments. For example, the sample-hold circuit 13S1 includes clocked inverters 13S11 and 13S13, and an inverter 13S12. The clocked inverters 13S11 and 13S13 become operative in response to a clock φ1S and a clock bar φ1S given thereto. Similarly, clocked inverters 13S21 and 13S23 in the sample-hold circuit 13S2 become operative in response to a clock φ2S and a clock bar φ2S which are given thereto. Respective clocks φ1S (bar φ1S), φ2S (bar φ2S), ..., φnS (bar φnS) sequentially shift to high level as shown in FIG. 16. Thus, the sample-hold circuits 13S1–13Sn sequentially sample and hold data Das and Dbs in synchronism with clock φ1s (bar φ1s)–φns (bar φns) respectively inputted thereto. In this case, data Das and Dbs change in level in synchronism with the timings of clocks φ1s–φns as shown in FIG. 16. Thus, data of different levels are sampled and held in the respective sample-hold circuits 13S11–13Sn. The data thus held are outputted as data 13a1–13an, and data 13b1–13bn, respectively.

These data 13a1–13an and 13b1–13bn are sequentially outputted to the potential data selection circuits 13R1–13Rn. In the case where the potential data selection circuit 13R1–13Rn have a configuration of the potential data selection circuit according to the first or second embodiment, each potential data selection circuit includes sample-hold circuit 11, decoder 13, multiplexer 15, and source follower amplifier 16 or voltage follower amplifier 26. On the other hand, in the case where the potential data selection circuits 13R1–13Rn have a configuration according to the fifth or sixth embodiment, each potential data selection circuit includes sample-hold circuit 11, multiplexer 75, and source follower amplifier 16 or voltage follower amplifier 26.

Even in the case where a potential data selection circuit according to any one of the embodiments mentioned above is employed, potential data selection circuits 13R1–13Rn is caused to be supplied with held data 13a1–13an and 13b1–13bn to hold them in synchronism with a clock φL. In the respective potential data selection circuits 13R1–13Rn, an operation similar to that of any one of the above-described first, second, fifth or sixth embodiment is carried out. Namely, in the sample-hold circuit 11, data 13a1–13an and 13b1–13bn are respectively held. In dependency upon the logic levels of these data, any one of potential data Va–Vd is selected by the decoder 13 and the multiplexer 15 or the multiplexer 75. The selected one of potential data Va–Vd is subjected to impedance conversion by the source follower amplifier 16 or the voltage follower amplifier 26, and is outputted to the exterior as data 13Q1–13Qn.

Figure 17:
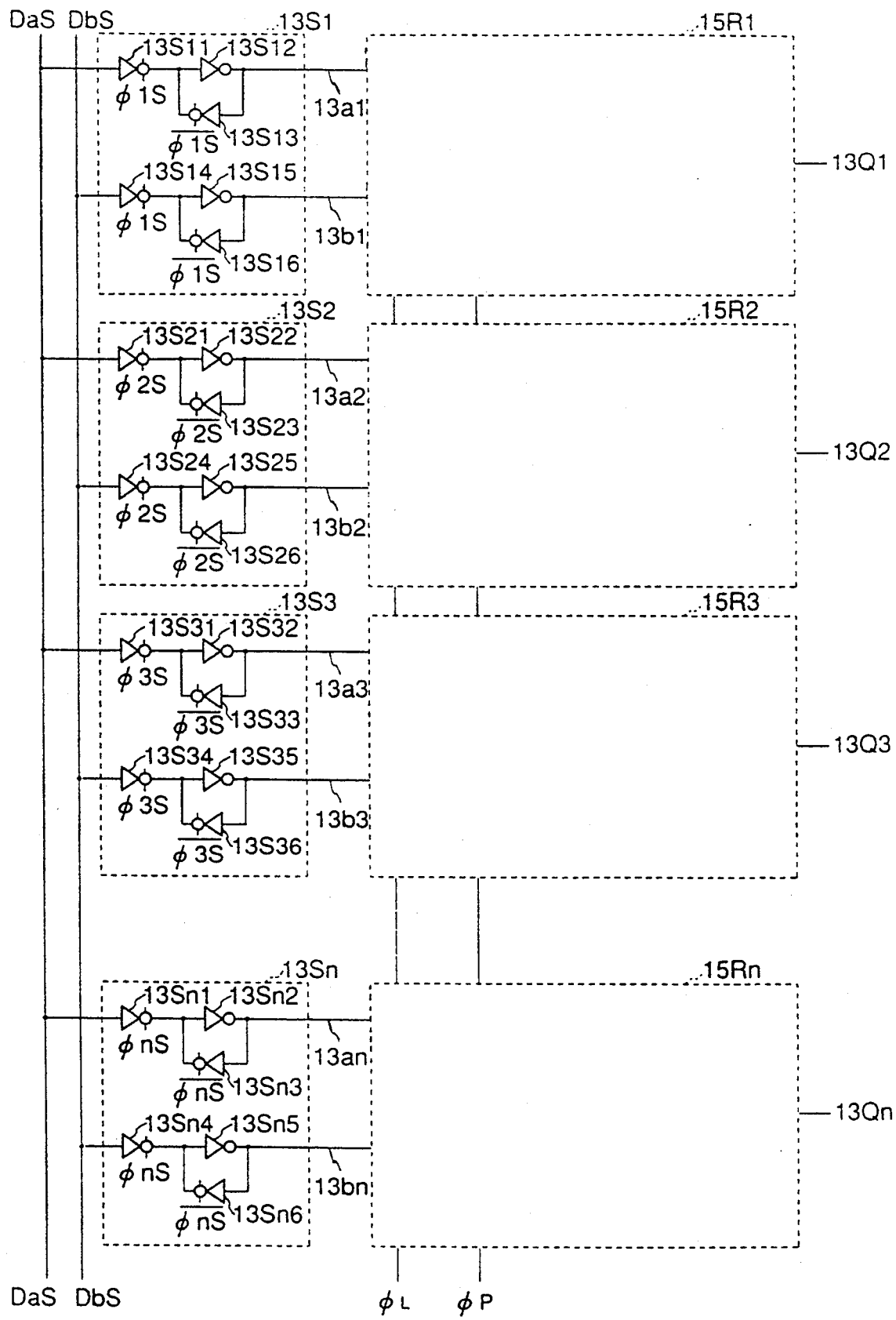
FIG. 17 is a circuit diagram showing the configuration of a potential data selection circuit according to a tenth embodiment of this invention.
Figure 18:
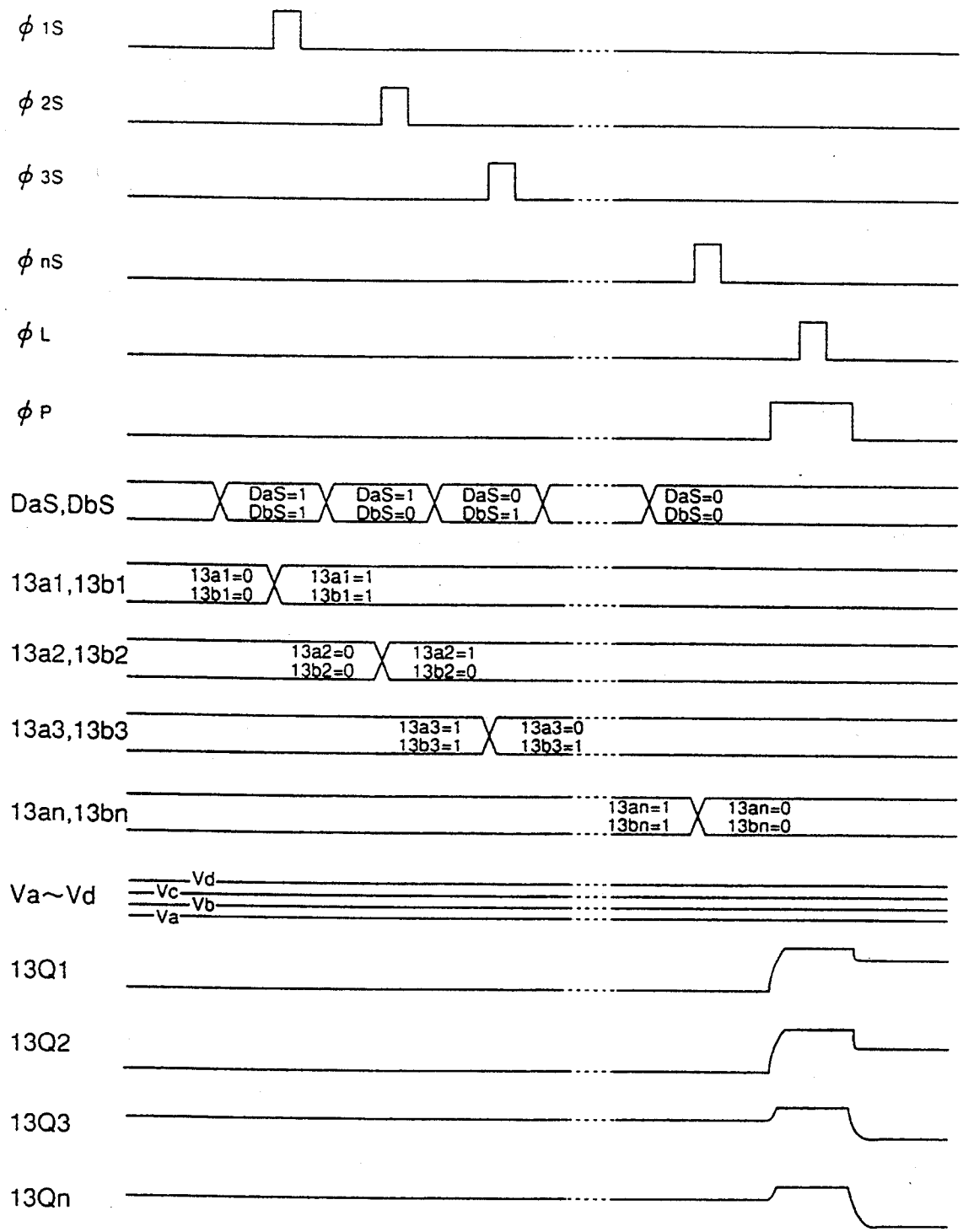
FIG. 18 is a timing chart showing waveforms of respective signals in the above-mentioned tenth embodiment.

A potential data selection circuit according to an tenth embodiment of this invention will now be described. The configuration of this embodiment is as shown in FIG. 17. The potential data selection circuit of this embodiment includes n (n is an integer equal to 2 or more) potential data selection circuits according to any one of the above-described third, fourth, seventh and eighth embodiments, and the sample-hold circuits 13S1–13Sn are supplemented in correspondence with the respective potential data selection circuits 15R1–15Rn. The timing chart of respective signals in the eleventh embodiment is shown in FIG. 18.

The configuration of each of the sample-hold circuits 13S1–13Sn is the same as that of the ninth embodiment. The sample-hold circuits 13S11–13Sn sequentially sample and hold data Das and Dbs in synchronism with clocks $\phi 1S$ (bar $\phi 1S$)–$\phi nS$ (bar $\phi nS$) respectively inputted thereto. The data thus held are outputted as data 13a1–13an and data 13b1–13bn, respectively.

These data 13a1–13an and 13b1–13bn are sequentially outputted to the potential data selection circuits 15R1–15Rn. In the case where the potential data selection circuits 15R1–15Rn have a configuration of the potential data selection circuit according to the third or fourth embodiment, each potential data selection circuit includes sample-hold circuit 11, decoder 43, multiplexer 45, and source follower amplifier 16 or voltage follower amplifier 26. On the other hand, in the case where the potential data selection circuits 15R1–15Rn have a configuration according to the seventh or eighth embodiment, each potential data selection circuit includes sample-hold circuit 11, multiplexer 105, and source follower amplifier 16 or voltage follower amplifier 26.

In the potential data selection circuits 15R1–15Rn, an operation described below will be performed. Namely, first in the multiplexer 45 or 105 as described above, the initial potential setting signal $\phi p$ is caused to be at high level, so the node of the output terminal is charged so that its potential level rises to the level of the power supply potential VDD. Thereafter, the initial potential setting signal $\phi p$ shifts to low level. Thus, charging of this cycle is completed. Further, the sample-hold circuit 11 is caused to be supplied with held data 13a1–13an and 13b1–13bn in synchronism with the clock $\phi L$ to hold them. In dependency upon the logic levels of respective data, any one of potential data Va–Vd is selected by the decoder 43 and the multiplexer 45 or the multiplexer 105. The selected one of potential data Va–Vd is subjected to impedance conversion by the source follower amplifier 16 or the voltage follower amplifier 26. The data thus obtained is outputted as data 13Q1–13Qn to the exterior.

As stated above, in accordance with the ninth or tenth embodiment, a plurality of potential data selection circuits are provided, and sample-hold circuits are supplemented in correspondence with respective potential data selection circuits to allow the holding operations of the sample-hold circuits to be synchronous with clocks $\phi 1s$–$\phi 1n$, thereby making it possible to sequentially select any different one of potential data Va–Vd to output the selected one. Similarly to the first to eighth embodiments, output of selected potential data is carried out through the source follower amplifier 16 or the voltage follower amplifier 26. Accordingly, also in the case where there is a need to drive a load of a large capacity at a high speed, it is sufficient to allow the drive capability of the source follower amplifier 16 or the voltage follower amplifier 26. Namely, there is no necessity to enhance the current drive capability of the analog switch of the multiplexer, or to broaden the widths of wires for supplying potential data Va–Vd. Thus, the pattern area can be reduced.

It should be noted that all the above-described embodiments are presented only for illustrative purpose, and do not limit this invention in any sense. While the source follower amplifier and the voltage follower amplifier are shown as the output circuit in the above-described embodiments, there may be employed an output circuit of any other structure capable of outputting a signal having the same potential as that of potential data selected by the multiplexer and outputted therefrom.

Figure 19:
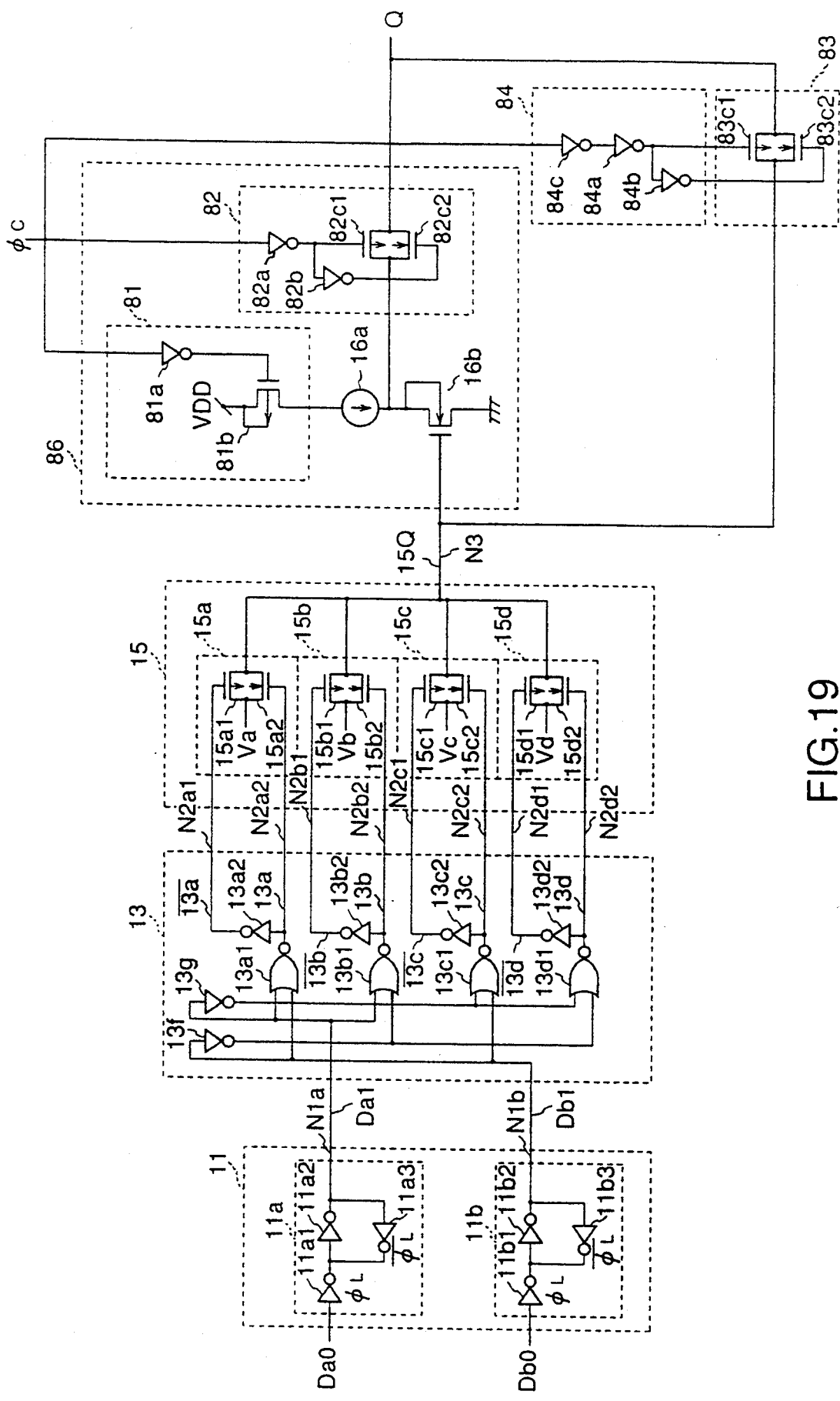
FIG. 19 is a circuit diagram showing the configuration of a potential data selection circuit according to an eleventh embodiment of this invention.

The configuration of a potential data selection circuit according to a eleventh embodiment of this invention is shown in FIG. 19. This embodiment corresponds to the embodiment wherein, in the first embodiment shown in FIG. 3, there is provided, in place of the source follower amplifier 16, an output circuit 86 including a control circuit 81 for allowing the current consumption to be small, and a control circuit 82 for allowing the output to be placed in a high impedance state; and there are supplemented an analog switch 83 connecting the node N3 of the output terminal of the multiplexer 15 and the node Q of the output terminal of the potential data selection circuit, and a control circuit 84 for controlling the analog switch 83.

Figure 21:
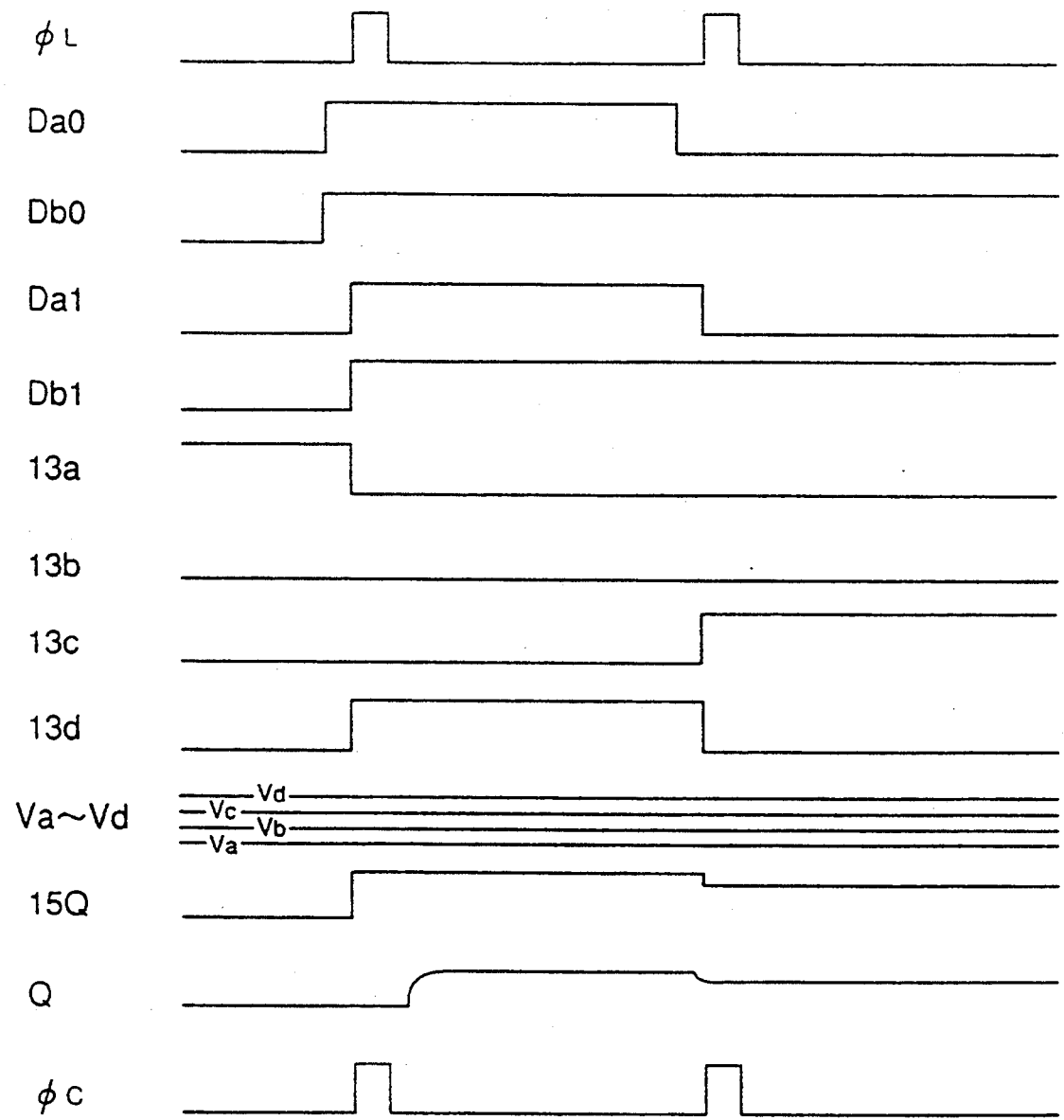
FIG. 21 is a timing chart showing waveforms of respective signals in the above-mentioned eleventh or twelfth embodiment.
Figure 22:
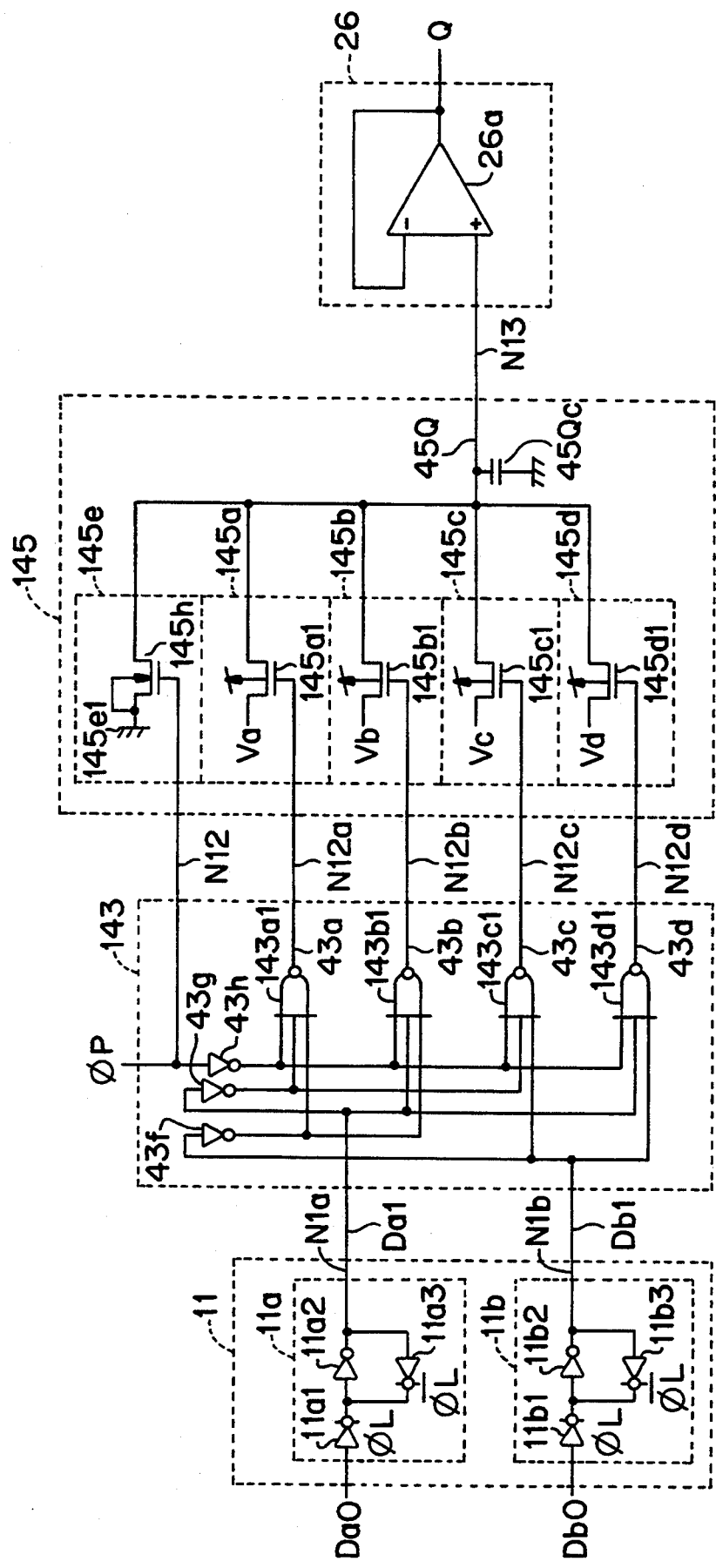
FIG. 22 is a circuit diagram showing the configuration of a potential data selection circuit according to a thirteenth embodiment of the invention.
Figure 23:
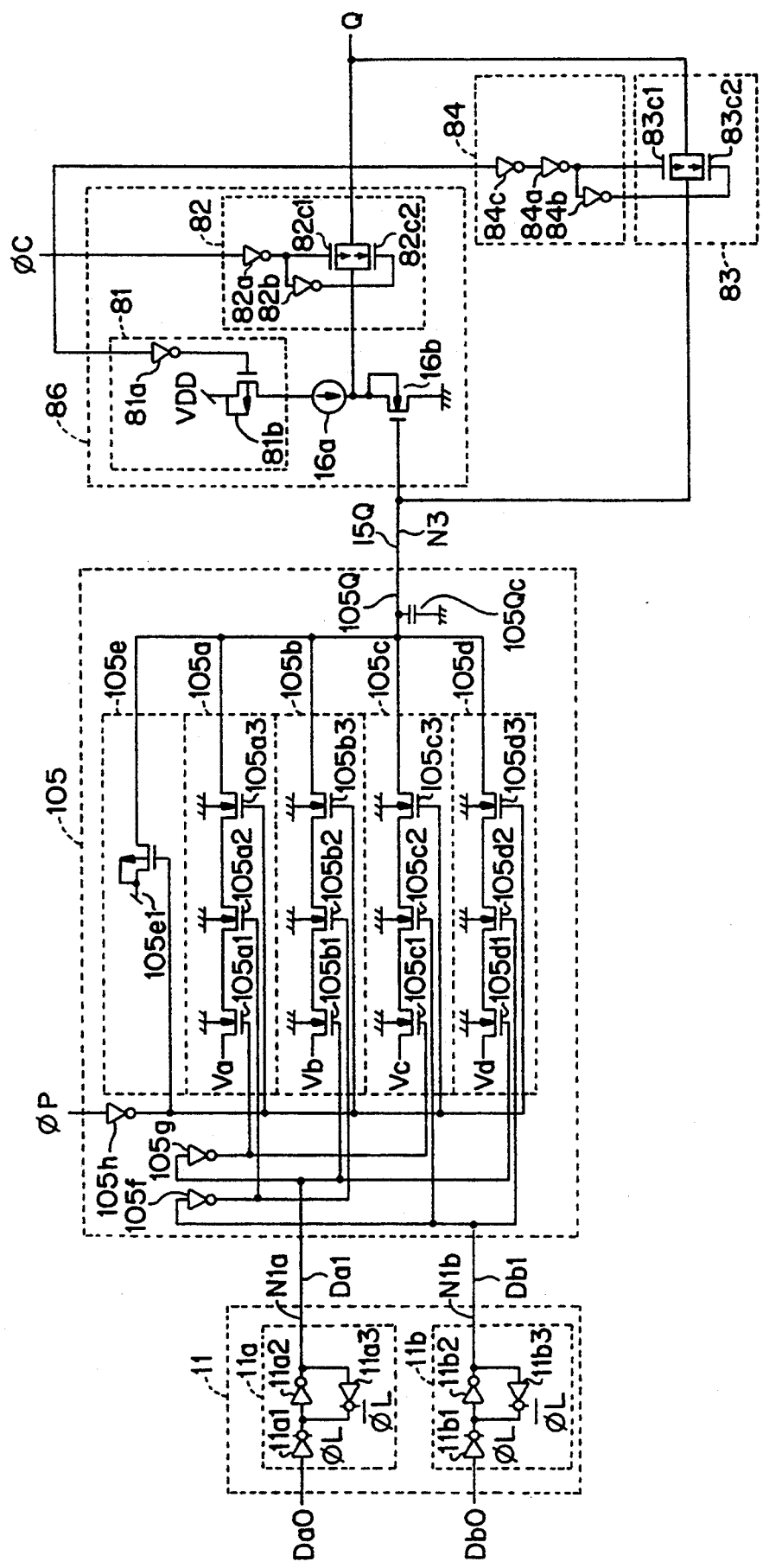
FIG. 23 is a circuit diagram showing the configuration of a potential data selection circuit according to a fourteenth embodiment of the invention.
Figure 24:
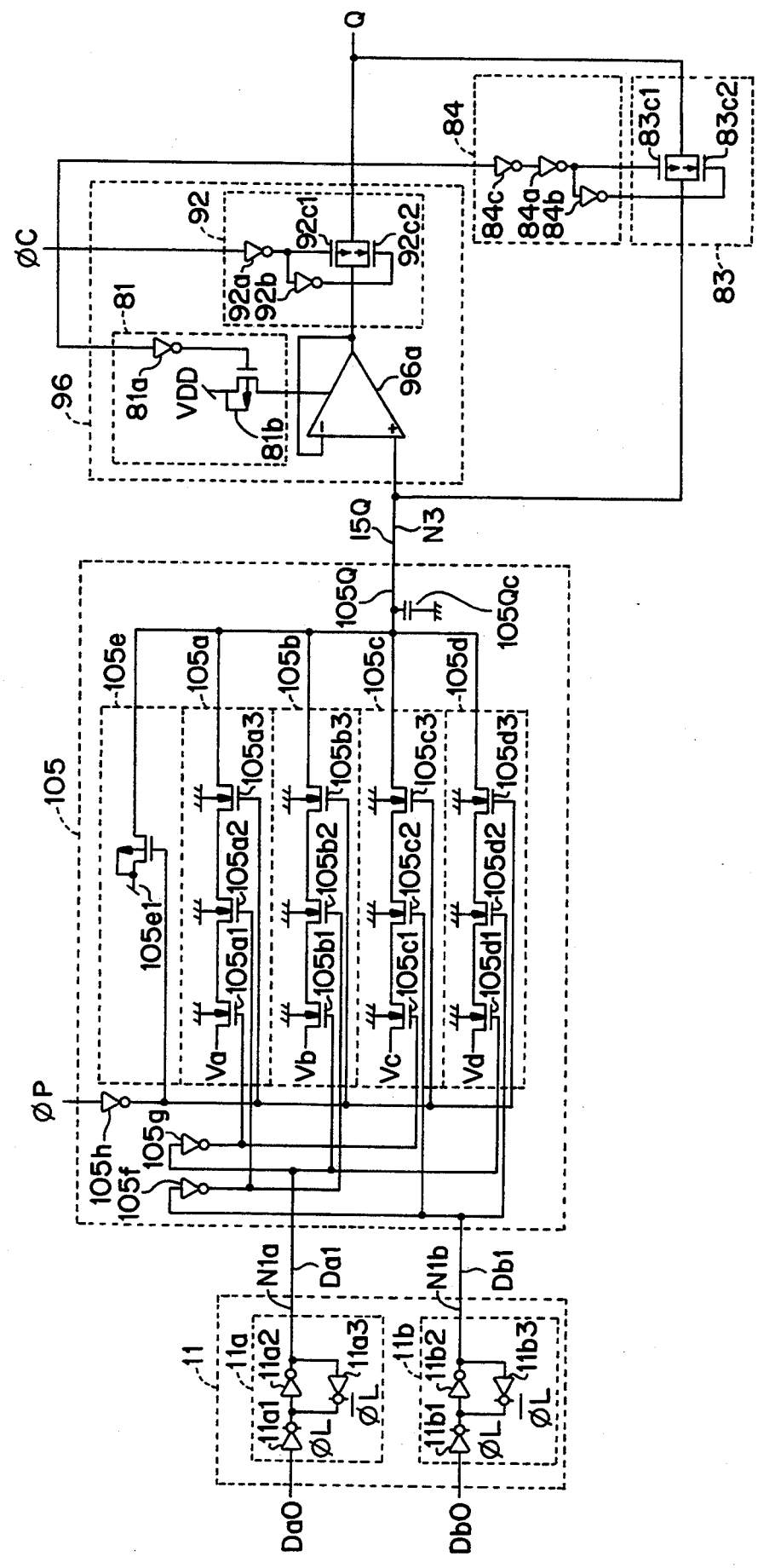
FIG. 24 is a circuit diagram showing the configuration of a potential data selection circuit according to a fifteenth embodiment of the invention.
Figure 25:
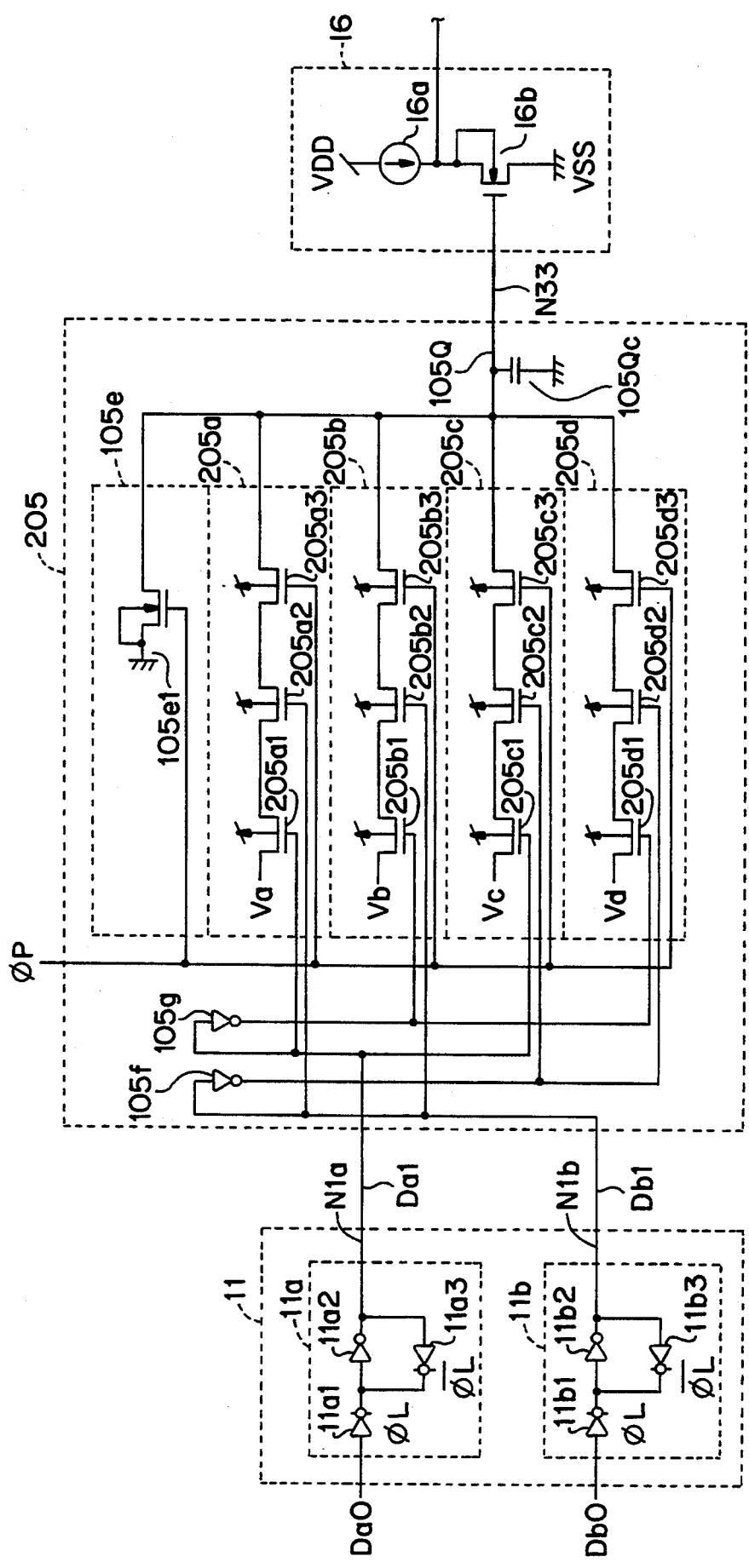
FIG. 25 is a circuit diagram showing the configuration of a potential data selection circuit according to a sixteenth embodiment of the invention.
Figure 26:
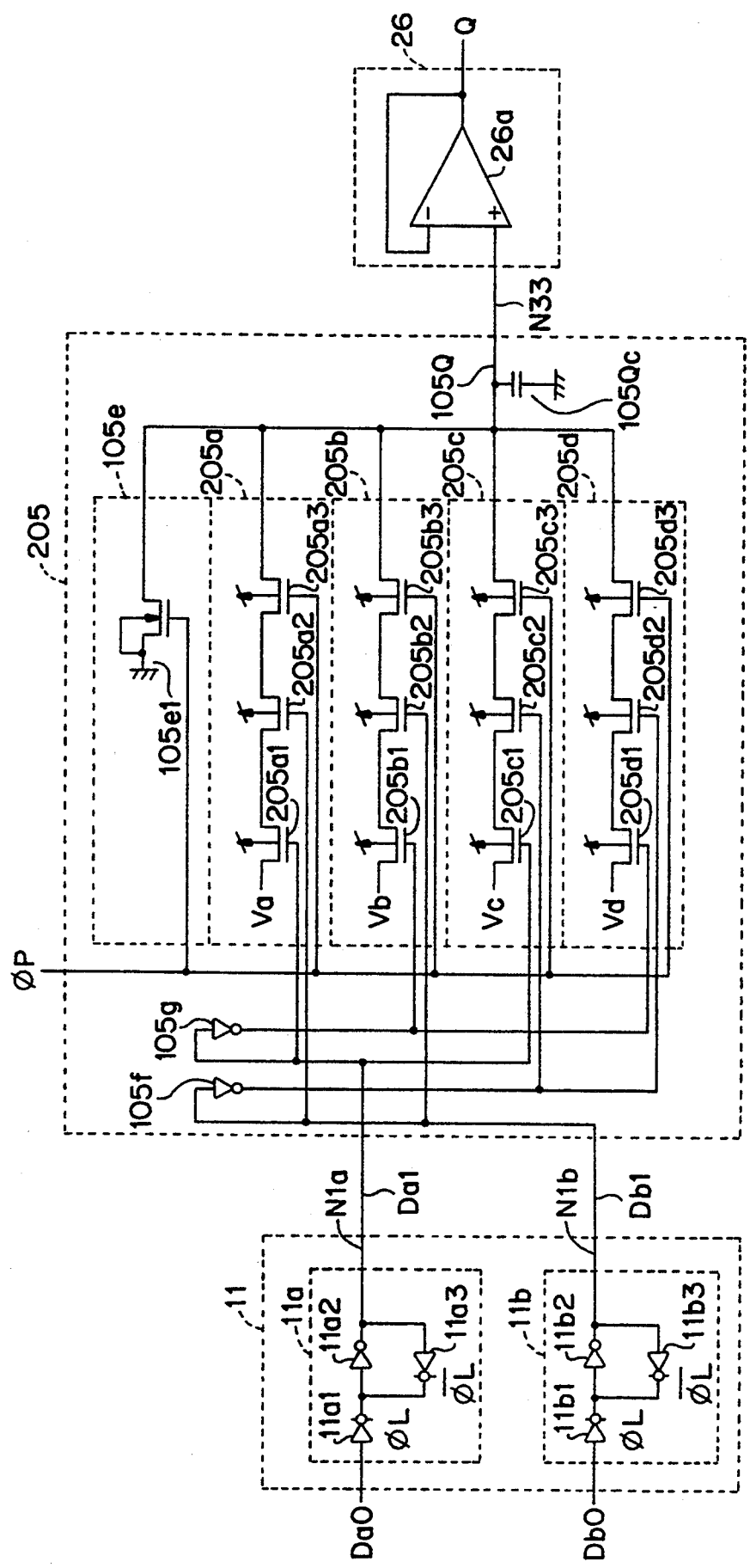
FIG. 26 is a circuit diagram showing the configuration of a potential data selection circuit according to a seventeenth embodiment of the invention.
Figure 27:
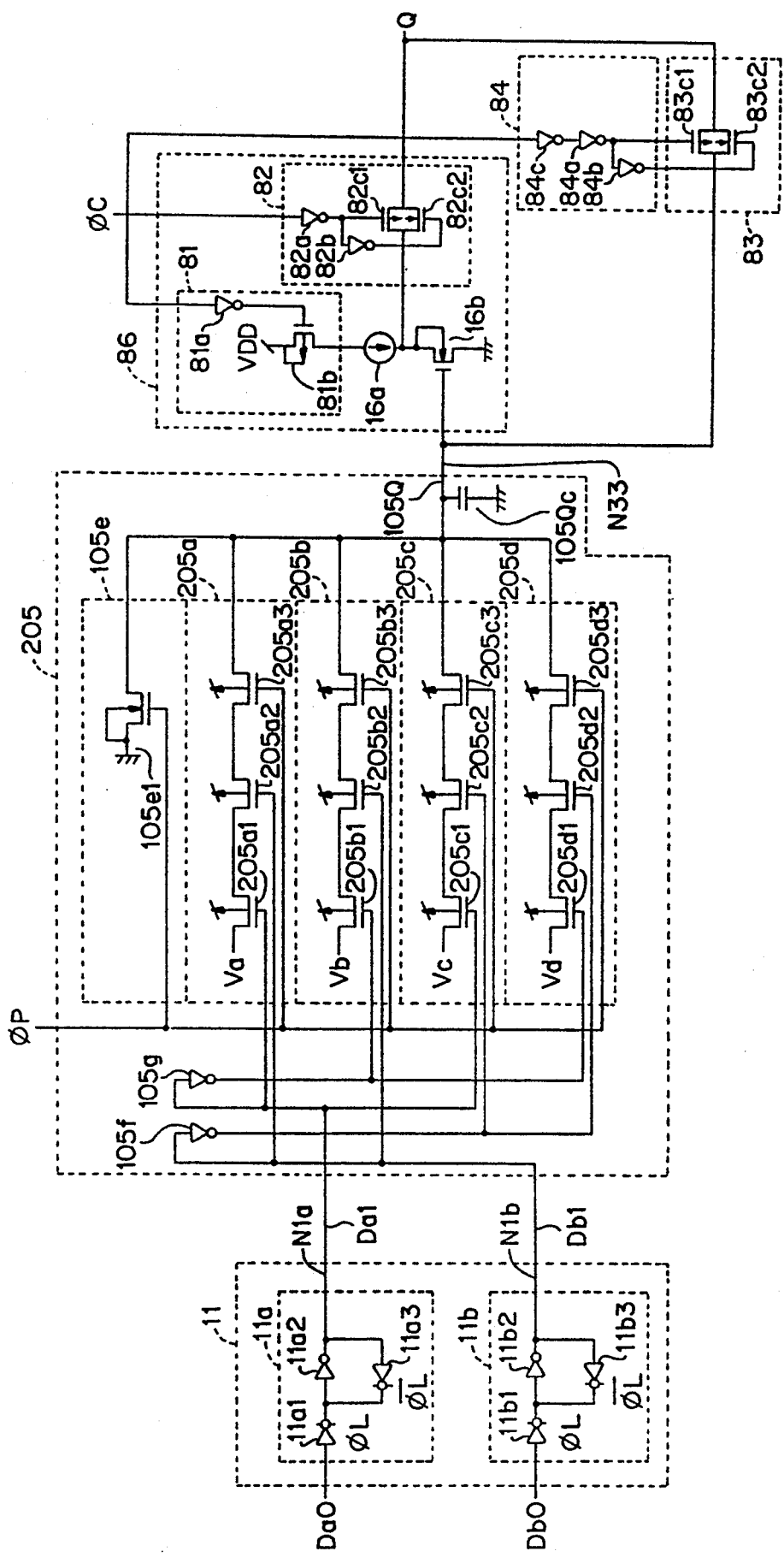
FIG. 27 is a circuit diagram showing the configuration of a potential data selection circuit according to a eighteenth embodiment of the invention.
Figure 28:
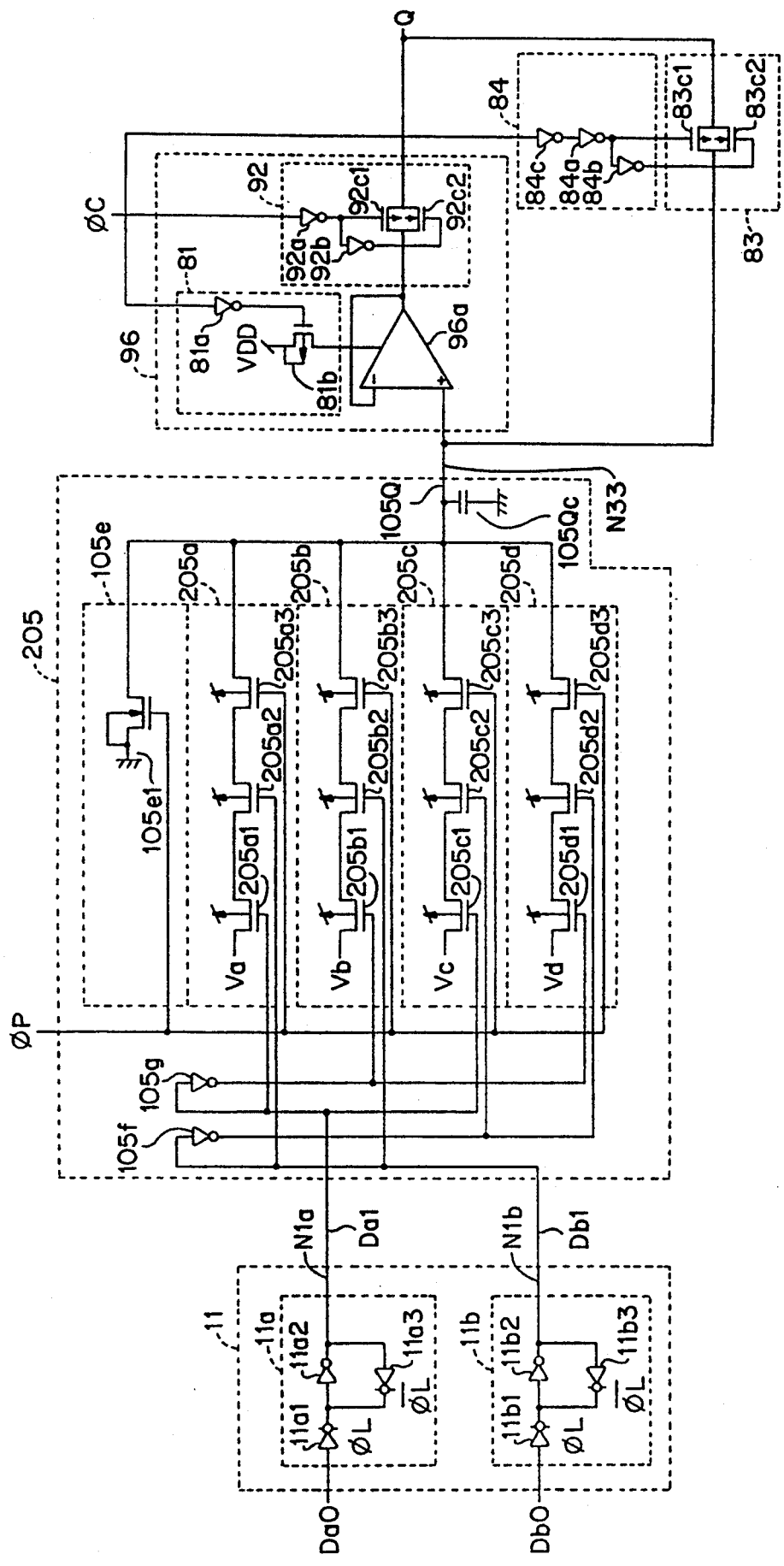
FIG. 28 is a circuit diagram showing the configuration of a potential data selection circuit according to a nineteenth embodiment of the invention.

In this embodiment, as indicated by the timing chart of FIG. 21, selection data DaO and DbO are sampled by a clock $\phi L$, and any one of potential data Va–Vd is selected by the multiplexer. Namely, an operation similar to that of the first embodiment shown in FIG. 3 is performed until selected potential data is outputted to the node N3 of the output terminal of the multiplexer 15.

After any one of potential data Va–Vd is selected by the multiplexer and is outputted to the node N3 of the output terminal of the multiplexer 15, the control signal $\phi c$ of the output circuit is caused to be at logic "1" level, and an inverter 81a output in the control circuit 81 which has received the control signal $\phi c$ of the output circuit is caused to be at logic "0" level. As a result, the P-channel transistor 81b is turned ON. In this embodiment, the source of the P-channel transistor 81b is connected to the power supply voltage VDD terminal, and the drain thereof is connected to constant current source 16a. When this P-channel transistor is turned ON, the source follower amplifier comprised of a control circuit 81, a constant current source 16a, and an N-channel transistor 16b is placed in an enable (operative) state. The node N3 of the output terminal of the multiplexer 15 is connected to the gate of the N-channel transistor 16b of the source follower amplifier. Any selected potential data is subjected to impedance conversion by the source follower amplifier. The control signal $\phi c$ is inputted also to the control circuit 82. As a result, the output of the inverter 82a is caused to be at logic "0" level, and the output of the inverter 82b is caused to be at logic "1" level. Thus, the P-channel transistor 82c1 and the N-channel transistor 82c are both turned ON. The output terminal of the source follower amplifier is connected to the sources of the P-channel transistor 82c1 and the N-channel transistor 82c2, and the drain is connected to the output node Q of the potential data selection circuit. Thus, a signal which has been subjected to impedance conversion by the source follower amplifier is outputted to the node Q of the output terminal through the P-channel transistor 82c1 and the N-channel transistor 82c2. At this time, the control signal φC is inputted also to the control circuit 84. As a result, the output of the inverter 84c is caused to be at logic "0" level, the output of the inverter 84a is caused to be at logic "1" level, and the output of the inverter 85b is caused to be at logic "0" level. Thus, the P-channel transistor 83c1 and the N-channel transistor 83c2 in the analog switch 83 are both turned OFF.

After the potential on the node Q of the output terminal is switched by an output of the output circuit 86 and the switched output is stabilized, the control signal φC of the output circuit is caused to be at logic "0", and the output of the inverter 81a in the control circuit 81 which has received the control signal φC of the output circuit is caused to be at logic "1" level. As a result, the P-channel transistor 81b is turned OFF, so the power supply voltage VDD is not delivered to the constant current source 16a. For this reason, the source follower amplifier is placed in disable (inoperative) state and no operation current flows. The control signal φC is inputted also to the control circuit 82. At this time, the output of the inverter 82a is caused to be at logic "1" level, and the output of the inverter 82b is caused to be at logic "0". As a result, the P-channel transistor 82c1 and the N-channel transistor 82c2 are both turned OFF. Thus, the output of the output circuit 86 is placed in high impedance state. At this time, the control signal φC is inputted also to the control circuit 84. The output of the inverter 84c is caused to be at logic "1" level, the output of the inverter 84a is caused to be at logic "0" level, and the output of the inverter 85b is caused to be at logic "1" level. As a result, the P-channel transistor 83c1 and the N-channel transistor 83c2 in the analog switch 83 are both turned ON. Thus, an output of the multiplexer 15 is delivered to the node Q of the output terminal through the analog switch 83, thus to carry out adjustment and holding of an output potential.

Thus, there is no necessity of enhancing the current drive capability of analog switches 15a–15d of the multiplexer 15, or broadening the widths of wires for delivering potential data Va–Vd. Thus, not only the area of the mask pattern can be reduced to a greater degree than in the case of the prior art, but also a small error between an input potential and an output potential existing in the output circuit can be eliminated. Further, output switching is carried out at a high speed, thus making it possible to lessen an unnecessary current consumption.

Figure 20:
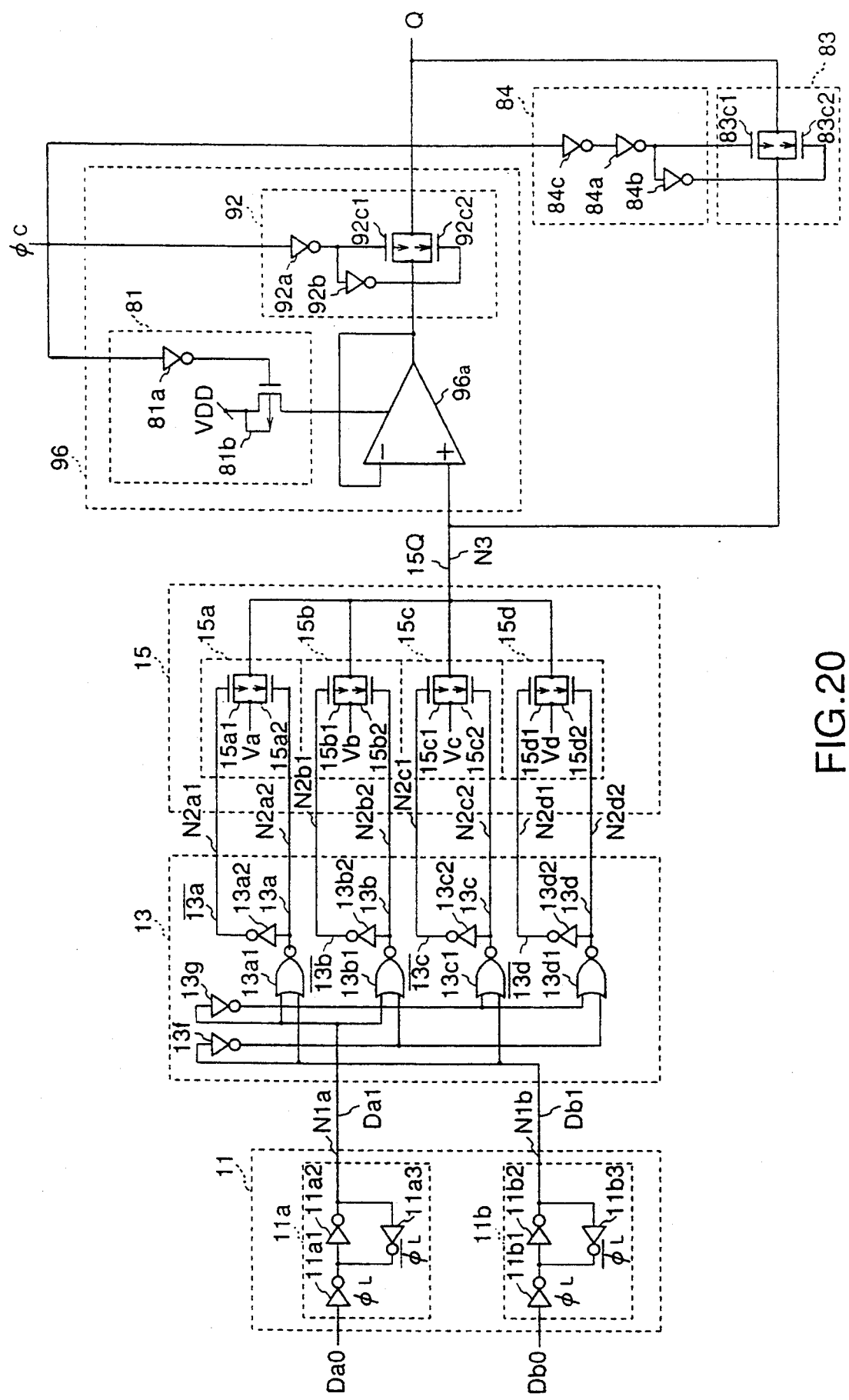
FIG. 20 is a circuit diagram showing the configuration of a potential data selection circuit according to a twelfth embodiment of this invention.

The configuration of a potential data selection circuit according to a twelfth embodiment of this invention is shown in FIG. 20. In this embodiment, there is provided a voltage follower amplifier in place of the source follower amplifier. In this voltage follower amplifier, the node N3 of the output terminal of the multiplexer 15 is connected to the non-inverting input terminal of a differential amplifier 96a, the output terminal of the differential amplifier 96a is connected to the inverting input terminal, and the power voltage VDD is delivered to the differential amplifier 96a through the control circuit 81.

The timing chart of respective signals in this embodiment is as shown in FIG. 21 similarly to the eleventh embodiment. Also in accordance with the twelfth embodiment, the effects and/or advantages similar to those of the eleventh embodiment can be provided. Namely, any one of potential data Va–Vd is selected in dependency upon the data DaO and DbO. The data thus selected is subjected to impedance conversion at the voltage follower amplifier, and is then outputted to the exterior. After output is switched, the output of the voltage follower amplifier is placed in high impedance state. Thus, it is possible to reduce current consumption to directly provide an output of the multiplexer 15 through the analog switch 83.

As stated above, there is no necessity of enhancing the current drive capability of analog switches 15a–15d of the multiplexer 15, and of broadening the width of wires for delivering potential data Va–Vd. Accordingly, not only the area of the mask pattern can be reduced to a greater degree than in the conventional circuit, but also a small error between an input potential and an output potential existing in the output circuit can be eliminated, and output switching is carried out at a high speed, thus making it possible to lessen an unnecessary current consumption.

As described in detail, the potential data selection circuit according to this invention is constructed so that, in selecting any one of plural potential data to output the selected one to the exterior, such selected data is caused to be outputted through the output circuit. Accordingly, even if the dimensions of the analog switches of the multiplexer or the widths of wires for delivering potential data of the analog switch are reduced, it is possible to drive an external large capacity load at a high speed. Thus, the mask pattern can be reduced.

What is claimed is:

1. A potential data selection circuit comprising:
   a sample-hold circuit adapted for sampling and holding selection data of at least 2 bits to output such data;
   a decoder adapted so that said selection data outputted from said sample-hold circuit are given thereto to decode said selection data to output control signals;
   a multiplexer including analog switches adapted so that at least two potential data are respectively given thereto, and adapted so that said control signals outputted from said decoder are given thereto to control operations of said analog switches to select any one of said potential data to output a selected one; and
   an output circuit adapted so that said potential data selected by said multiplexer and output therefrom is given thereto to output a signal of a voltage corresponding to said selected potential data to an exterior,
   wherein said multiplexer includes an initial potential setting unit, analog switches each comprised of an N-channel MOS transistor, and a discharging unit,
   wherein said initial potential setting unit is adapted to set in advance a potential on an output terminal of said multiplexer to an initial potential higher than potentials of said at least two potential data,
   wherein said analog switches are adapted so that said potential data are respectively given thereto to select any one of said potential data thereby on a basis of said control signals outputted from said decoder to output the selected one thereby, and wherein said discharging unit is adapted to carry out a discharge operation to allow the potential on said output terminal set to said initial potential to fall to a potential of said potential data selected by said analog switches and outputted therefrom, and thus carry out output of said potential data.

2. A potential data selection circuit comprising:

a sample-hold circuit adapted for sampling and holding selection data of at least 2 bits to output such data;

a decoder adapted so that said selection data outputted from said sample-hold circuit are given thereto to decode said selection data to output control signals;

a multiplexer including analog switches adapted so that at least two potential data are respectively given thereto, and adapted so that said control signals outputted from said decoder are given thereto to control operations of said analog switches to select any one of said potential data to output a selected one; and an output circuit adapted so that said potential data selected by said multiplexer and output therefrom is given thereto to output a signal of a voltage corresponding to said selected potential data to an exterior, wherein said multiplexer includes an initial potential setting unit, analog switches each comprised of a P-channel MOS transistor, and a potential setting unit is adapted to set in advance a potential on an output terminal of said multiplexer to an initial potential lower than potentials of said at least two potential data, wherein said analog switches are adapted so that said potential data are respectively given thereto to select any one of said potential data thereby on a basis of said control signal outputted from said decoder to output the selected one thereby and wherein said charging unit is adapted to carry out a charge operation to allow the potential on said output terminal set to said initial potential by said initial potential setting unit to rise to a potential of said potential data selected by said analog switches and outputted therefrom thus to carry out output of said potential data.

3. A potential data selection circuit comprising:

a sample-hold circuit adapted for sampling and holding selection data of at least 2 bits to output such data;

a decoder adapted so that said selection data outputted from said sample-hold circuit are given thereto to decode said selection data to output control signals;

a multiplexer including analog switches adapted so that at least two potential data are respectively given thereto, and adapted so that said control signals outputted from said decoder are given thereto to control operations of said analog switches to select any one of said potential data to output a selected one; and an output circuit adapted so that said potential data selected by said multiplexer and output therefrom is given thereto to output a signal of a voltage corresponding to said selected potential data to an exterior, wherein there are provided plural sets of said sample-hold circuit, plural sets of said decoder and plural sets of said multiplexer, wherein first sample-hold circuits are further provided respectively in correspondence with said sets of said sample-hold circuit, wherein said first sample-hold circuits are connected to a data bus common thereto to sequentially sample and hold selection data of at least two bits serially transferred by way of said data bus to output the selection data, and wherein said sets of said sample-hold circuit are adapted so that said selection data outputted from said first sample-hold circuits are given to said corresponding sets of said sample-hold circuit to hold and output said selection data.

4. A potential data selection circuit comprising:

a sample-hold circuit adapted for sampling and holding selection data of at least 2 bits to output such data;

a decoder adapted so that said selection data outputted from said sample-hold circuit are given thereto to decode said selection data to output control signals;

a multiplexer including analog switches adapted so that at least two potential data are respectively given thereto, and adapted so that said control signals outputted from said decoder are given thereto to control operations of said analog switches to select any one of said potential data to output a selected one; and an output circuit adapted so that said potential data selected by said multiplexer and output therefrom is given thereto to output a signal of a voltage corresponding to said selected potential data to an exterior, wherein said output circuit includes a first control circuit for allowing current consumption in said output circuit to be small, a second control circuit coupled to said first control circuit for allowing an output of said output circuit to be placed in a high impedance state, an analog switch connecting an output terminal of said multiplexer and an output terminal of said potential data selection circuit, and a third control circuit for controlling said analog switch.

5. A potential data selection circuit comprising:

a sample-hold circuit adapted for sampling and holding selection data of at least 2 bits to output such data;

a multiplexer including an inversion selection data generation unit, and analog switches each comprised of a plurality of MOS transistors adapted so that at least two potential data are respectively given thereto;

said inversion selection data generation unit being adapted so that said selection data outputted from said sample-hold circuit are given thereto to generate inversion selection data by inverting said selection data, said analog switches being adapted so that said selection data outputted from said sample-hold circuit and said inversion selection data outputted from said inversion selection data generation unit are given to gates of said MOS transistors to control their ON/OFF operations thus to select and output one of said potential data; and an output circuit adapted so that said potential data selected by said multiplexer and outputted therefrom is given thereto to output a signal of a voltage corresponding to said selected potential data to an exterior, wherein there are provided plural sets of said sample-hold circuit and plural sets of said multiplexer, wherein first sample-hold circuits are further provided respectively in correspondence with said sets of said sample-hold circuit, wherein said first sample-hold circuits are connected to a data bus common thereto to sequentially sample and hold selection data of at least two bits serially transferred by way of said data bus to output the selection data, and wherein said sets of said sample-hold circuit are adapted so that said selection data outputted from said first sample-hold circuits are given to said corresponding sets of said sample-hold circuit to hold and output said selection data.

6. A potential data selection circuit comprising:

a sample-hold circuit adapted for sampling and holding selection data of at least 2 bits to output such data;

a multiplexer including an inversion selection data generation unit, and analog switches each comprised of a plurality of MOS transistors adapted so that at least two potential data are respectively given thereto;

said inversion selection data generation unit being adapted so that said selection data outputted from said sample-hold circuit are given thereto to generate inversion selection data by inverting said selection data, said analog switches being adapted so that said selection data outputted from said sample-hold circuit and said inversion selection data outputted from said inversion selection data generation unit are given to gates of said MOS transistors to control their ON/OFF operations thus to select and output one of said potential data; and an output circuit adapted so that said potential data selected by said multiplexer and outputted therefrom is given thereto to output a signal of a voltage corresponding to said selected potential data to an exterior, wherein said output circuit includes a first control circuit for allowing current consumption in said output circuit to be small, a second control circuit coupled to said first control circuit for allowing an output of said output circuit to be placed in a high impedance state, an analog switch connecting an output terminal of said multiplexer and an output terminal of said potential data selection circuit, and a third control circuit for controlling said analog switch.

7. A potential data selection circuit comprising:

a sample-hold circuit for sampling and holding selection data of at least 2 bits to output such data; and a multiplexer including an inversion selection data generation unit, an initial potential setting unit, analog switches each comprised of a plurality of N-channel MOS transistors adapted so that at least two potential data are respectively given thereto, and a discharging unit;

said inversion selection data generation unit being adapted so that said selection data outputted from said sample-hold circuit are given thereto to generate inversion selection data by inverting said selection data, said initial potential setting unit being adapted to set in advance a potential on an output terminal of said multiplexer to an initial potential higher than potentials of said potential data, said analog switches being adapted so that said selection data outputted from said sample-hold circuit and said inversion selection data outputted from said inversion selection data generation unit are given to gates of said N-channel MOS transistors to control their ON/OFF operations, thus to select and output one of said potential data, said discharging unit being operative to carry out a discharge operation to allow a potential on said output terminal set to said initial potential by said initial potential setting unit to fall to a potential of said potential data selected by said analog switches and outputted therefrom to thereby carry out output of said potential data; and an output circuit adapted so that said potential data selected by said multiplexer and outputted therefrom is given thereto to output a signal of a voltage corresponding to said selected potential data to an exterior.

8. A potential data selection circuit as set forth in claim 7, wherein there are provided plural sets of said sample-hold circuit, and plural sets of said multiplexer, wherein first sample-hold circuits further provided respectively in correspondence with said sets of said sample-hold circuit, said first sample-hold circuits being connected to a data bus common thereto to sequentially sample and hold selection data of at least 2 bits serially transferred by way of said data bus to output the selection data, said sets of said sample-hold circuit being adapted so that said selection data outputted from said first sample-hold circuits are given to said corresponding sets of said sample-hold circuit to hold and output said selection data.

9. A potential data selection circuit as set forth in claim 7, wherein said output circuit is a voltage follower amplifier.

10. A potential data selection circuit as set forth in claim 7, wherein said output circuit comprises a first control circuit for allowing current consumption in said output circuit to be small, a second control circuit coupled to said first control circuit for allowing an output of said output circuit to be placed in a high impedance state, an analog switch connecting an output terminal of said multiplexer and an output terminal of said potential data selection circuit, and a third control circuit for controlling said analog switch.

11. A potential data selection circuit comprising:

a sample-hold circuit for sampling and holding selection data of at least 2 bits to output such data;

a multiplexer including an inversion selection data generation unit, an initial potential setting unit, analog switches each comprised of a plurality of P-channel MOS transistors adapted so that at least two potential data are respectively given thereto, and a charging unit;

said inversion selection data generation unit being adapted so that said selection data outputted from said sample-hold circuit are given thereto to generate inversion selection data by inverting said selection data, said initial potential setting unit being operative to set in advance a potential on an output terminal of said multiplexer to an initial potential lower than potentials of said potential data, said analog switches being adapted so that said selection data outputted from said sample-hold circuit and said inversion selection data outputted from said inversion selection data generation unit are given to gates of said P-channel MOS transistors to control their ON/OFF operations thus to select and output one of said potential data, said charging unit being operative to carry out a charge operation to allow said potential on said output terminal set to said initial potential by said initial potential setting unit to rise to a potential of said potential data selected by said analog switches and outputted therefrom, thus to provide an output of said potential data; and an output circuit adapted so that said potential data selected by said multiplexer and outputted therefrom is given thereto to output a signal of a voltage corresponding to said selected potential data to an exterior.

12. A potential data selection circuit as set forth in claim 11,
wherein there are provided plural sets of said sample-hold circuit and plural sets of said multiplexer, wherein first sample-hold circuits are further provided respectively in correspondence with said sets of said sample-hold circuit, said first sample-hold circuits being connected to a data bus common thereto to sequentially sample and hold selection data of at least 2 bits serially transferred by way of said data bus to output the selection data, said sets of said sample-hold circuit being adapted so that said selection data outputted from said first sample-hold circuits are given to said corresponding sets of said sample-hold circuit to hold and output said selection data.

13. A potential data selection circuit as set forth in claim 11, wherein said output circuit is a voltage follower amplifier.

14. A potential data selection circuit as set forth in claim 11, wherein said output circuit comprises a first control circuit for allowing current consumption in said output circuit to be small, a second control circuit coupled to said first control circuit for allowing an output of said output circuit to be placed in a high impedance state, an analog switch connecting an output terminal of said multiplexer and an output terminal of said potential data selection circuit, and a third control circuit for controlling said analog switch.

* * * * *